US012199166B2

(12) United States Patent
Lee

(10) Patent No.: US 12,199,166 B2
(45) Date of Patent: Jan. 14, 2025

(54) SEMICONDUCTOR MEMORY DEVICE AND METHOD OF MANUFACTURING THE SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/330,062

(22) Filed: Jun. 6, 2023

(65) Prior Publication Data

US 2023/0317816 A1 Oct. 5, 2023

Related U.S. Application Data

(63) Continuation of application No. 16/953,786, filed on Nov. 20, 2020, now Pat. No. 11,705,501.

(30) Foreign Application Priority Data

Jun. 22, 2020 (KR) ........................ 10-2020-0076048

(51) Int. Cl.
*H01L 29/51* (2006.01)
*H01L 29/10* (2006.01)
*H10B 43/27* (2023.01)

(52) U.S. Cl.
CPC ........ *H01L 29/513* (2013.01); *H01L 29/1037* (2013.01); *H10B 43/27* (2023.02)

(58) Field of Classification Search
CPC .......................... H01L 29/513; H01L 29/1037
See application file for complete search history.

(56) References Cited

U.S. PATENT DOCUMENTS 10,128,257 B2 11/2018 Pang et al.
2016/0204117 A1 7/2016 Liu et al.
2017/0243879 A1 8/2017 Yu et al.
2017/0271261 A1* 9/2017 Tsutsumi ............... H10B 43/10
2018/0190667 A1* 7/2018 Pang ...................... H10B 43/35
2021/0036003 A1* 2/2021 Pachamuthu ..... H01L 21/02667

FOREIGN PATENT DOCUMENTS

CN 108447865 A 8/2018
CN 108630699 A 10/2018
CN 110176460 A 8/2019
CN 108447865 B 9/2019
CN 110676257 A 1/2020
CN 110890420 A 3/2020
KR 1020170136363 A 12/2017
KR 20190113192 A * 10/2019
KR 1020200053067 A 5/2020

* cited by examiner

*Primary Examiner* — Mohammad M Choudhry
(74) *Attorney, Agent, or Firm* — WILLIAM PARK & ASSOCIATES LTD.

(57) ABSTRACT

Provided herein may be a semiconductor memory device and a method of manufacturing the semiconductor memory device. The semiconductor memory device includes a stacked body including interlayer insulating layers and a select line disposed between the interlayer insulating layers, a core insulating layer penetrating the stacked body, a semiconductor pattern extending along a sidewall of the core insulating layer and including an undoped area disposed between the select line and the core insulating layer, doped semiconductor patterns disposed between the semiconductor pattern and the interlayer insulating layers, and a gate insulating layer disposed between the semiconductor pattern and the select line.

12 Claims, 27 Drawing Sheets

SEMICONDUCTOR MEMORY DEVICE AND METHOD OF MANUFACTURING THE SEMICONDUCTOR MEMORY DEVICE

CROSS-REFERENCE TO RELATED APPLICATION

The present application is a continuation application of U.S. patent application Ser. No. 16/953,786, filed on Nov. 20, 2020, and claims priority under 35 U.S.C. § 119(a) to Korean patent application number 10-2020-0076048, filed on Jun. 22, 2020, in the Korean Intellectual Property Office, the entire disclosure of which is incorporated herein by reference.

BACKGROUND

1. Technical Field

Various embodiments of the present disclosure relate to a semiconductor memory device and a method of manufacturing the semiconductor memory device, and more particularly to a three-dimensional (3D) semiconductor memory device and a method of manufacturing the 3D semiconductor memory device.

2. Related Art

A semiconductor memory device includes memory cells which can store data. A three-dimensional (3D) semiconductor memory device includes memory cells arranged in three dimensions, thus reducing an area occupied by memory cells per unit area of a substrate.

In order to improve the degree of integration of the 3D semiconductor memory device, the number of stacks of memory cells may be increased. As the number of stacks of memory cells is increased, the operational reliability of the 3D semiconductor memory device may be deteriorated.

SUMMARY

An embodiment of the present disclosure may provide for a semiconductor memory device. The semiconductor memory device may include a stacked body including interlayer insulating layers and a select line disposed between the interlayer insulating layers, a core insulating layer penetrating the stacked body, a semiconductor pattern extending along a sidewall of the core insulating layer and including an undoped area disposed between the select line and the core insulating layer, doped semiconductor patterns disposed between the semiconductor pattern and the interlayer insulating layers, and a gate insulating layer disposed between the semiconductor pattern and the select line.

An embodiment of the present disclosure may provide for a semiconductor memory device. The semiconductor memory device may include a first stacked body including first interlayer insulating layers and first conductive patterns that are alternately disposed in a stacking direction, a first channel structure penetrating the first stacked body, a second stacked body overlapping the first stacked body and including second interlayer insulating layers stacked in the stacking direction and a second conductive pattern disposed between the second interlayer insulating layers, a second channel structure penetrating the second stacked body to come into contact with the first channel structure, and a gate insulating layer disposed between the second channel structure and the second conductive pattern. Here, the second channel structure may include a semiconductor pattern including an undoped area surrounded by the gate insulating layer and penetrating the second stacked body, and doped semiconductor patterns disposed between the semiconductor pattern and the second interlayer insulating layers, and separated from each other by the gate insulating layer.

An embodiment of the present disclosure may provide for a method of manufacturing a semiconductor memory device. The method may include forming an interlayer insulating layer and a sacrificial layer that are alternately stacked, forming a hole passing through the interlayer insulating layer and the sacrificial layer, forming a doped semiconductor layer on a surface that defines the hole, forming an undoped semiconductor layer on the doped semiconductor layer, opening a gate region by removing the sacrificial layer, forming a gate insulating layer by oxidizing a part of the doped semiconductor layer through the gate region, and forming a conductive pattern to surround the gate insulating layer and fill the gate region.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and should not be construed as being limited to the specific embodiments set forth herein.

Hereinafter, the terms 'first' and 'second' are used to distinguish one component from another component. As such, the components should not be limited by these terms. For example, a first component may be referred to as a second component without departing from a scope in accordance with the concept of the present disclosure and similarly, a second component may be referred to as a first component.

Various embodiments of the present disclosure are directed to a semiconductor memory device which can improve operational reliability, and a method of manufacturing the semiconductor memory device.

Figure 1:
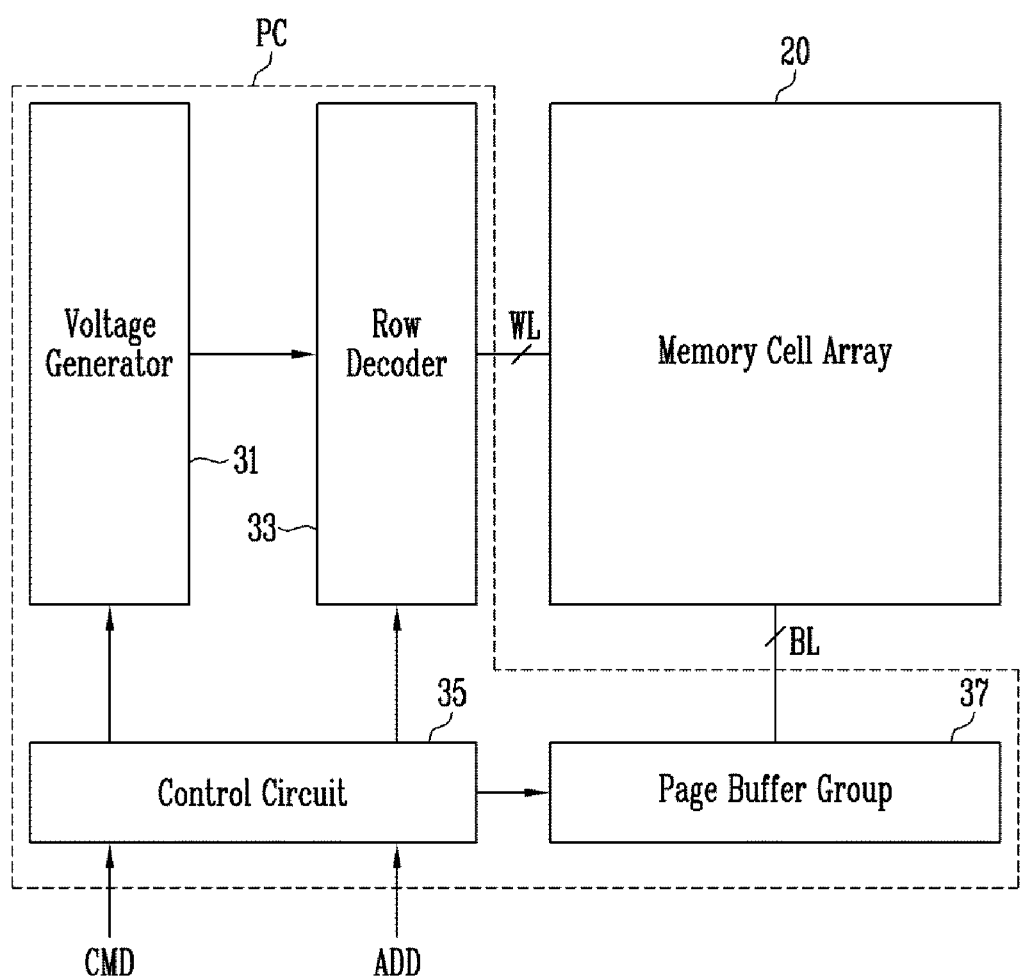
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device 10 may include a peripheral circuit PC and a memory cell array 20.

The peripheral circuit PC may control a program operation of storing data in the memory cell array 20, a read operation of outputting data stored in the memory cell array 20, and an erase operation of erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be coupled to the row decoder 33 through word lines WL, and may be coupled to the page buffer group 37 through bit lines BL.

The control circuit 35 may control the peripheral circuit PC in response to a command CMD and an address ADD.

The voltage generator 31 may generate various operating voltages, such as a pre-erase voltage, an erase voltage, a ground voltage, a program voltage, a verify voltage, a pass voltage, and a read voltage, which are used for a program operation, a read operation, and an erase operation, under the control of the control circuit 35.

The row decoder 33 may select a memory block under the control of the control logic 35. The row decoder 33 may apply the operating voltages to word lines WL coupled to the selected memory block.

The page buffer group 37 may be coupled to the memory cell array 20 through the bit lines BL. The page buffer group 37 may temporarily store data received from an input/output circuit (not illustrated) under the control of the control circuit 35 during a program operation. The page buffer group 37 may sense voltages or currents of the bit lines BL under the control of the control circuit 35 during a read operation or a verify operation. The page buffer group 37 may select the bit lines BL under the control of the control circuit 35.

Each of the memory blocks in the memory cell array 20 may include a plurality of cell strings.

Figure 2:
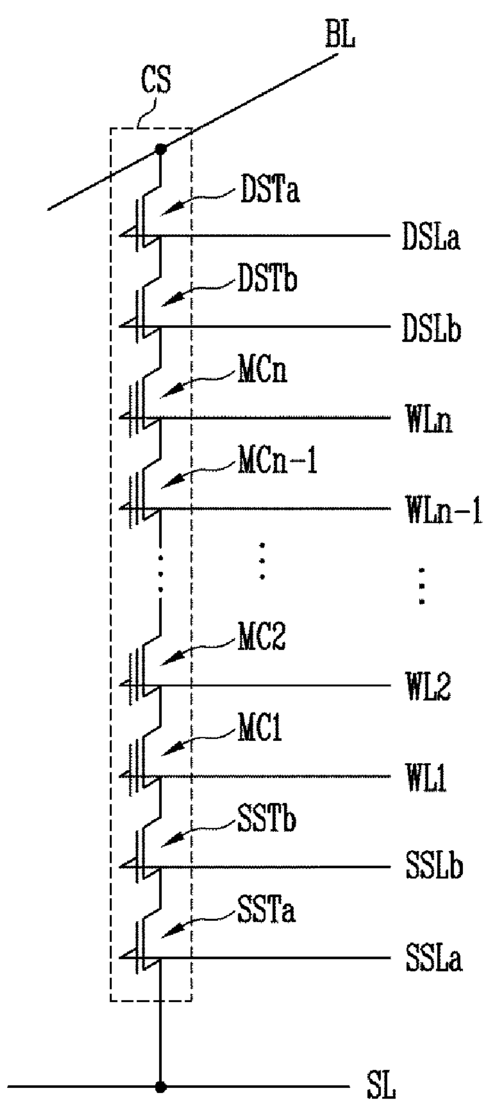
FIG. 2 is a circuit diagram illustrating a cell string according to an embodiment of the present disclosure.

FIG. 2 is a circuit diagram illustrating a cell string CS according to an embodiment of the present disclosure.

Referring to FIG. 2, the cell string CS may be coupled to a source layer SL and a bit line BL. The cell string CS may include a plurality of memory cells MC1 to MCn, one or more source select transistors SSTa and SSTb, and one or more drain select transistors DSTa and DSTb.

The plurality of memory cells MC1 to MCn may be coupled in series to each other. Gates of the plurality of memory cells MC1 to MCn may be respectively coupled to a plurality of word lines WL1 to WLn stacked to be spaced apart from each other.

The one or more source select transistors SSTa and SSTb may control electrical coupling between the cell string CS and the source layer SL. In an embodiment, the cell string CS may include one source select transistor SSTa disposed between the source layer SL and the plurality of memory cells MC1 to MCn. In an embodiment, the cell string CS may include two or more source select transistors SSTa and SSTb disposed between the source layer SL and the plurality of memory cells MC1 to MCn and coupled in series to each other. Gates of the source select transistors SSTa and SSTb may be coupled to source select lines SSLa and SSLb, respectively.

The one or more drain select transistors DSTa and DSTb may control electrical coupling between the cell string CS and the bit line BL. In an embodiment, the cell string CS may include one drain select transistor DSTa disposed between the bit line BL and the plurality of memory cells MC1 to MCn. In an embodiment, the cell string CS may include two or more drain select transistors DSTa and DSTb disposed between the bit line BL and the plurality of memory cells MC1 to MCn and coupled in series to each other. Gates of the drain select transistors DSTa and DSTb may be coupled to drain select lines DSLa and DSLb, respectively.

The source select lines SSLa and SSLb, the plurality of word lines WL1 to WLn, and the drain select lines DSLa and DSLb may be implemented using conductive patterns stacked to be spaced apart from each other.

The erase operation of the semiconductor memory device may be performed using a gate induced drain leakage (GIDL) current. The GIDL current may be generated due to the difference between an erase voltage applied to the bit line BL and a gate voltage applied to each of the drain select lines DSLa and DSLb.

Figure 3:
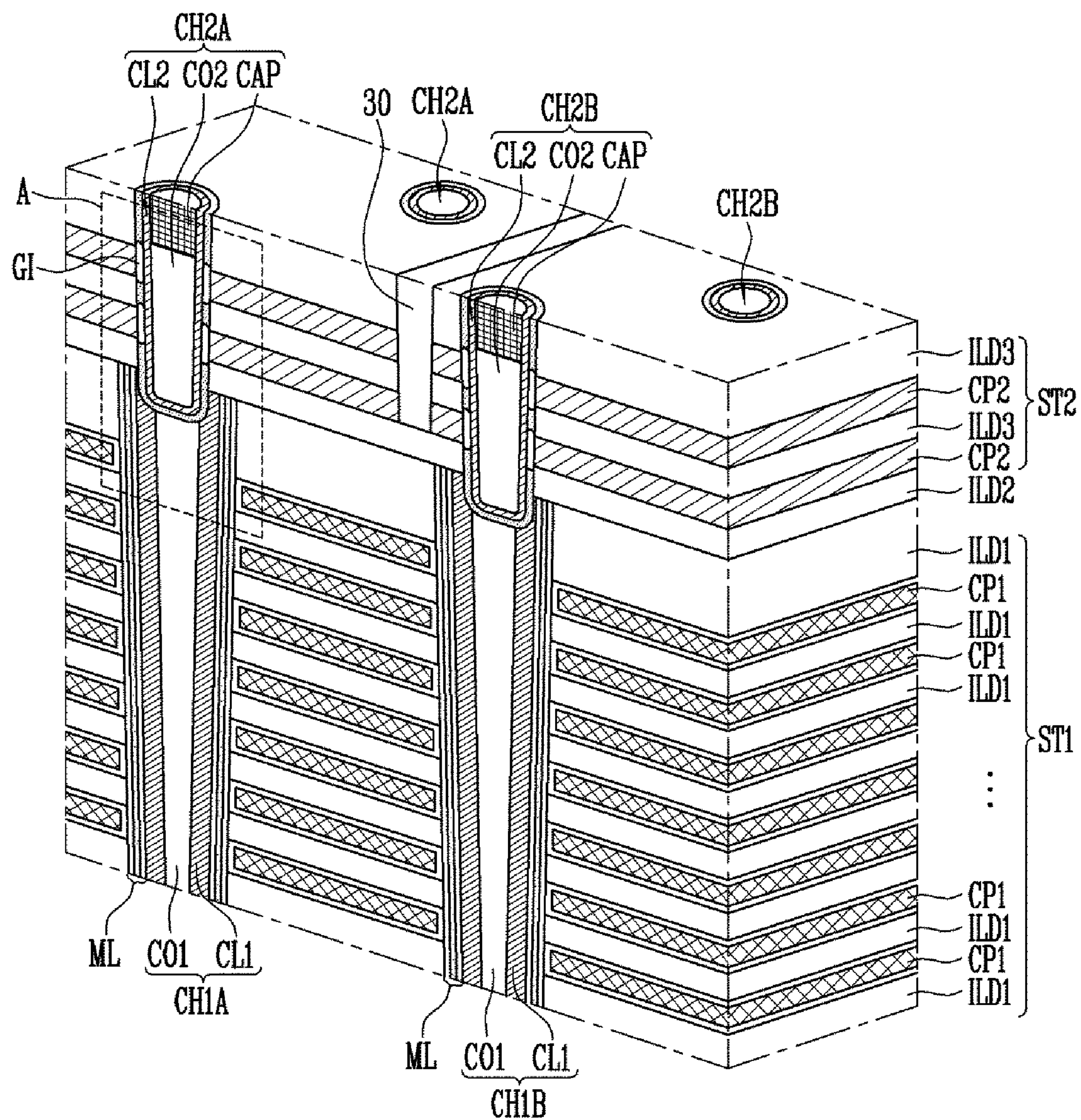
FIG. 3 is a perspective view schematically illustrating a semiconductor memory device according to an embodiment of the present disclosure.

FIG. 3 is a perspective view schematically illustrating a semiconductor memory device according to an embodiment of the present disclosure.

Referring to FIG. 3, the semiconductor memory device may include a first stacked body ST1 surrounding first channel structures CH1A and CH1B, second channel structures CH2A and CH2B overlapping the first channel structures CH1A and CH1B, respectively, and second stacked bodies ST2 overlapping the first stacked body ST1 and spaced apart from each other at the same level.

The first stacked body ST1 may include first interlayer insulating layers ILD1 and first conductive patterns CP1 which are alternately disposed in a stacking direction. The first conductive patterns CP1 may be used as the source select lines SSLa and SSLb and the plurality of word lines WL1 to WLn, which are illustrated in FIG. 2.

The first channel structures CH1A and CH1B may penetrate the first stacked body ST1. Each of the first channel structures CH1A and CH1B may include a first core insulating layer CO1 and a first channel layer CL1. The first core insulating layer CO1 may penetrate the first stacked body ST1, and the first channel layer CL1 may surround a sidewall of the first core insulating layer CO1. In an embodiment, the first channel layer CL1 may include an undoped semiconductor layer. In an embodiment, the undoped semiconductor layer may include undoped silicon.

The sidewall of each of the first channel structures CH1A and CH1B may be surrounded by a memory layer ML. The memory layer ML may be disposed between each of the first channel structures CH1A and CH1B and the first stacked body ST1.

The first stacked body ST1 and the first channel structures CH1A and CH1B may be covered with the second interlayer insulating layer ILD2.

Each of the second stacked bodies ST2 may include second conductive patterns CP2 and third interlayer insulating layers ILD3 which are alternately disposed in a stacking direction. The second conductive patterns CP2 may be disposed between a second interlayer insulating layer ILD2 and a third interlayer insulating layer ILD3 which neighbor the corresponding second conductive pattern CP2 in the stacking direction and between third interlayer insulating layers ILD3 which neighbor the corresponding second conductive pattern CP2 in the stacking direction.

The second stacked bodies ST2 may be separated from each other by an isolation insulating layer 30. The second stacked bodies ST2 may be used as select stacked bodies. In an embodiment, the second conductive patterns CP2 may be used as the drain select lines DSLa and DSLb illustrated in FIG. 2.

The second channel structures CH2A and CH2B may penetrate the second stacked bodies ST2 and the second interlayer insulating layer ILD2 to come into contact with the first channel structures CH1A and CH1B, respectively. Each of the second channel structures CH2A and CH2B may penetrate a part of the first core insulating layer CO1, and may come into contact with the first channel layer CL1.

Each of the second channel structures CH2A and CH2B may include a second core insulating layer CO2, a capping pattern CAP, and a second channel layer CL2. The second core insulating layer CO2 may penetrate the corresponding second stacked body ST2. The second core insulating layer CO2 may extend to penetrate the corresponding second interlayer insulating layer ILD2. The capping pattern CAP may overlap the corresponding second core insulating layer CO2. The capping pattern CAP may overlap the first channel structure CH1A or CH1B, with the second core insulating layer CO2 interposed therebetween. The second channel layer CL2 may extend along the sidewall and bottom surface of the second core insulating layer CO2. The second channel layer CL2 may come into contact with the corresponding first channel layer CL1. The second channel layer CL2, which is a select channel layer, may include dopants to stably induce a GIDL current during an erase operation. In an embodiment, the second channel layer CL2 may include n-type dopants.

Respective gate insulating layers GI may be disposed between the second channel structures CH2A and CH2B and the second conductive patterns CP2. The gate insulating layers GI may extend in a ring shape to surround partial regions of the second channel layers CL2 facing the sidewalls of the second conductive patterns CP2, respectively.

The second channel structures CH2A and CH2B may include second channel structures CH2A of a first group and second channel structures CH2B of a second group. The isolation insulating layer 30 may be disposed between the second channel structures CH2A of the first group and the second channel structures CH2B of the second group.

The first channel structures CH1A and CH1B may include first channel structures CH1A of a first group and first channel structures CH1B of a second group. The first channel structures CH1A of the first group may be coupled to the second channel structures CH2A of the first group, respectively. The first channel structures CH1B of the second group may be coupled to the second channel structures CH2B of the second group, respectively.

The first channel structures CH1A of the first group and the first channel structures CH1B of the second group may be controlled by the same first conductive pattern CP1. The second conductive pattern CP2 for controlling the second channel structures CH2A of the first group and the second conductive pattern CP2 for controlling the second channel structures CH2B of the second group may be separated from each other by the isolation insulating layer 30.

Figure 4A:
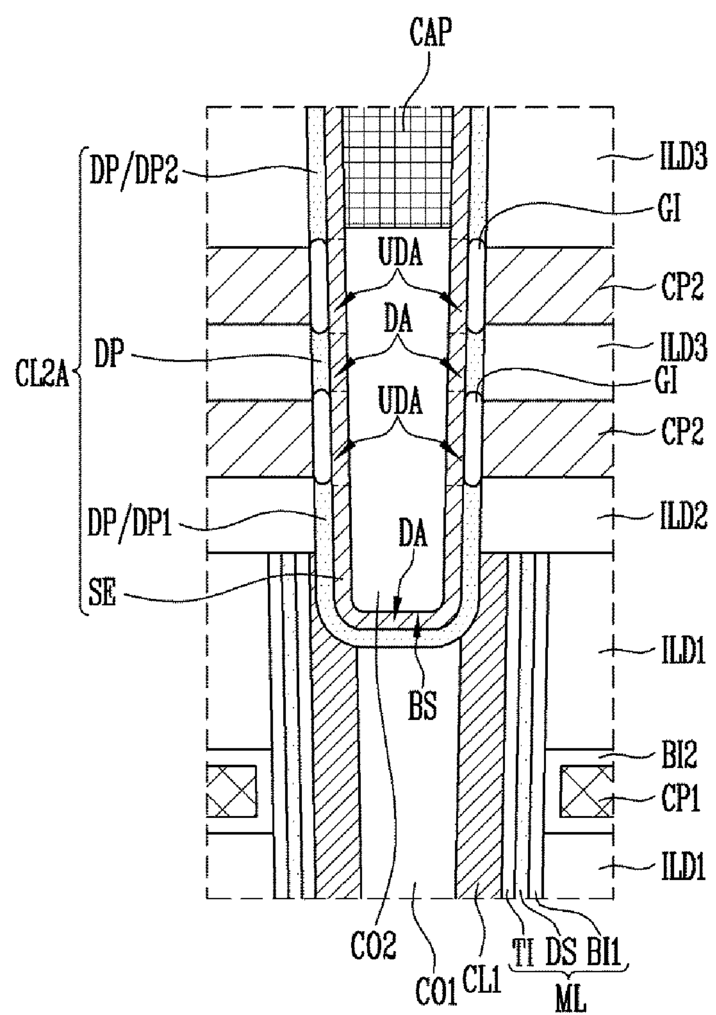
FIGS. 4A and 4B are sectional views illustrating channel structures according to embodiments of the present disclosure.
Figure 4B:
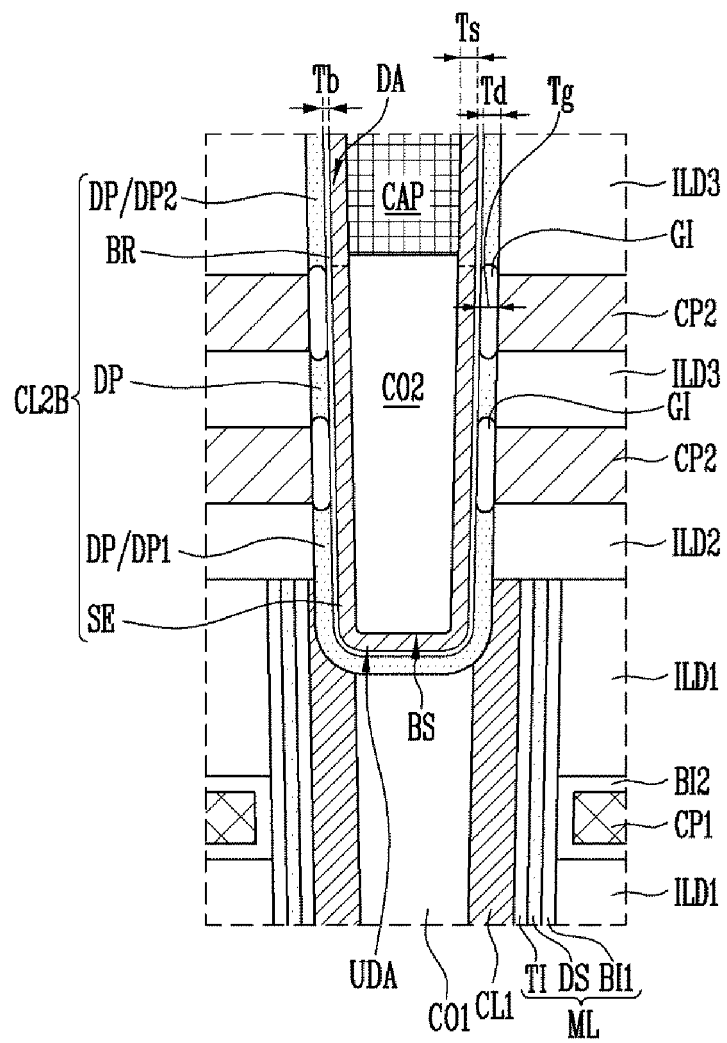

FIGS. 4A and 4B are sectional views illustrating channel structures according to embodiments of the present disclosure. FIGS. 4A and 4B are enlarged sectional views of region A illustrated in FIG. 3.

Referring to FIGS. 4A and 4B, a memory layer ML may include a tunnel insulating layer TI, a data storage layer DS, and a first blocking insulating layer BI1.

The tunnel insulating layer TI may surround a sidewall of the first channel layer CL1. The tunnel insulating layer TI may include an insulating material enabling charge tunneling. In an embodiment, the tunnel insulating layer TI may include a silicon oxide layer.

The data storage layer DS may surround a sidewall of the tunnel insulating layer TI. The data storage layer DS may include a material layer that is capable of storing data. In an embodiment, the data storage layer DS may be formed of a material layer that is capable of storing data that is changed using Fowler-Nordheim tunneling (F-N tunneling). For this operation, the data storage layer DS may be formed of a nitride layer that is capable of trapping charges. The present disclosure is not limited thereto, and the data storage layer DS may include a phase change material, nanodots, etc.

The first blocking insulating layer BI1 may surround a sidewall of the data storage layer DS. The first blocking insulating layer BI1 may include an oxide layer.

The first conductive pattern CP1 may surround the memory layer ML between first interlayer insulating layers ILD1 which neighbor the first conductive pattern CP1 in a stacking direction. A second blocking insulating layer BI2 may be formed between the first conductive pattern CP1 and the first blocking insulating layer BI1. The second blocking insulating layer BI2 may include an insulating material having permittivity higher than that of the first blocking insulating layer BI1. In an embodiment, the second blocking insulating layer BI2 may include a metal oxide layer. In an embodiment, the metal oxide layer may include an aluminum oxide layer. The second blocking insulating layer BI2 may extend to space between the first conductive pattern CP1 and the first interlayer insulating layers ILD1.

Referring to FIG. 4A, a second channel layer CL2A may include a semiconductor pattern SE and doped semiconductor patterns DP. The semiconductor pattern SE may include undoped areas UDA and doped areas DA.

Referring to FIG. 4B, a second channel layer CL2B may include a semiconductor pattern SE, a barrier pattern BR, and doped semiconductor patterns DP. The semiconductor pattern SE may include a doped area DA and an undoped area UDA.

Referring to FIGS. 4A and 4B, the doped semiconductor patterns DP may be disposed between the second interlayer insulating layer ILD2 and the semiconductor pattern SE and between third interlayer insulating layers ILD3 and the semiconductor pattern SE. The doped semiconductor patterns DP may be coupled to each other via the semiconductor pattern SE.

Because the doped semiconductor patterns DP may decrease the channel resistance of the second channel layer CL2A or CL2B, the channel current of the second channel layer CL2A or CL2B may be increased due to the doped semiconductor patterns DP. Due to the doped semiconductor patterns DP, a GIDL current may be stably secured during an erase operation of the semiconductor memory device. In an embodiment, the doped semiconductor patterns DP may include n-type dopants. In an embodiment, the doped semiconductor patterns DP may include n-type silicon.

The doped semiconductor patterns DP may include a first doped semiconductor pattern DP1 adjacent to the first channel layer CL1. The first doped semiconductor pattern DP1 may extend to space between the first channel structure CHIA or CH1B illustrated in FIG. 3 and the semiconductor pattern SE. The doped semiconductor patterns DP may include a second doped semiconductor pattern DP2 extending to surround a sidewall of a capping pattern CAP.

The capping pattern CAP may include a conductive material. The capping pattern CAP may include dopants for a junction overlap region. In an embodiment, the capping pattern CAP may include a semiconductor material doped with dopants of a same type as the doped semiconductor patterns DP. In an embodiment, the capping pattern CAP may include n-type doped silicon.

The doped semiconductor patterns DP may be separated from each other by gate insulating layers GI.

The gate insulating layers GI may be disposed between second conductive patterns CP2 and the semiconductor pattern SE. The gate insulating layers GI may overlap the doped semiconductor patterns DP. Each gate insulating layer GI may be disposed between the doped semiconductor patterns DP which neighbor the corresponding gate insulating layer GI in the stacking direction of the third interlayer insulating layers ILD3 and the second conductive patterns CP2. In an embodiment, the gate insulating layers GI may include silicon oxide.

The semiconductor pattern SE may extend along a sidewall and a bottom surface BS of the second core insulating layer CO2. The bottom surface BS of the second core insulating layer CO2 may face the first core insulating layer CO1. The semiconductor pattern SE may extend to surround the sidewall of the capping pattern CAP. In an embodiment, the semiconductor pattern SE may include silicon. The semiconductor pattern SE may include at least one undoped area UDA.

Referring to FIG. 4A, the semiconductor pattern SE may include undoped areas UDA disposed between the second core insulating layer CO2 and the second conductive patterns CP2. The undoped areas UDA may be surrounded by the gate insulating layers GI, respectively. In an embodiment, the semiconductor pattern SE may include doped areas DA disposed between the second core insulating layer CO2 and the doped semiconductor patterns DP. A partial area of the semiconductor pattern SE, which surrounds the sidewall of the capping pattern CAP, may be defined as a doped area DA. The doped areas DA may include dopants diffused from the doped semiconductor patterns DP and the capping pattern CAP. Dotted lines indicated in the semiconductor pattern SE represent boundaries between the doped areas DA and the undoped areas UDA according to an embodiment.

Referring to FIG. 4B, the barrier pattern BR may be disposed between the semiconductor pattern SE and the doped semiconductor patterns DP. The barrier pattern BR may extend along a sidewall and a bottom surface of the semiconductor pattern SE. In an embodiment, the barrier pattern BR may include an oxide layer.

The doped semiconductor patterns DP may be spaced apart from the semiconductor pattern SE by the barrier pattern BR. The thickness of the barrier pattern BR may be controlled such that each of the doped semiconductor patterns DP is electrically coupled to the semiconductor pattern SE. In other words, the thickness of the barrier pattern BR may be controlled such that the flow of current within the second channel layer CL2B is not impeded. In an embodiment, the thickness Tb of the barrier pattern BR may be formed to be less than the thickness Td of each doped semiconductor pattern DP, the thickness Ts of the semiconductor pattern SE, and the thickness Tg of the gate insulating layer GI. In an embodiment, the barrier pattern BR may be formed at a thickness of 30A or less.

A phenomenon in which dopants are diffused from the inside of the doped semiconductor patterns DP into the semiconductor pattern SE may be prevented through the barrier pattern BR. The undoped area UDA of the semiconductor pattern SE may be surrounded by the gate insulating layers GI and the second interlayer insulating layer ILD2, and may be surrounded by the third interlayer insulating layer ILD3 between the second conductive patterns CP2. A top of the semiconductor pattern SE may come into contact with the capping pattern CAP. The semiconductor pattern SE may include the doped area DA surrounding the sidewall of the capping pattern CAP. The doped area DA may include dopants diffused from the capping pattern CAP. Dotted lines indicated in the semiconductor pattern SE represent a boundary between the doped area DA and the undoped area UDA according to an embodiment.

By the undoped areas UDA, described above with reference to FIGS. 4A and 4B, the turn-off characteristics of select transistors which use the second channel layer CL2A or CL2B as a channel area may be secured.

Figure 5A:
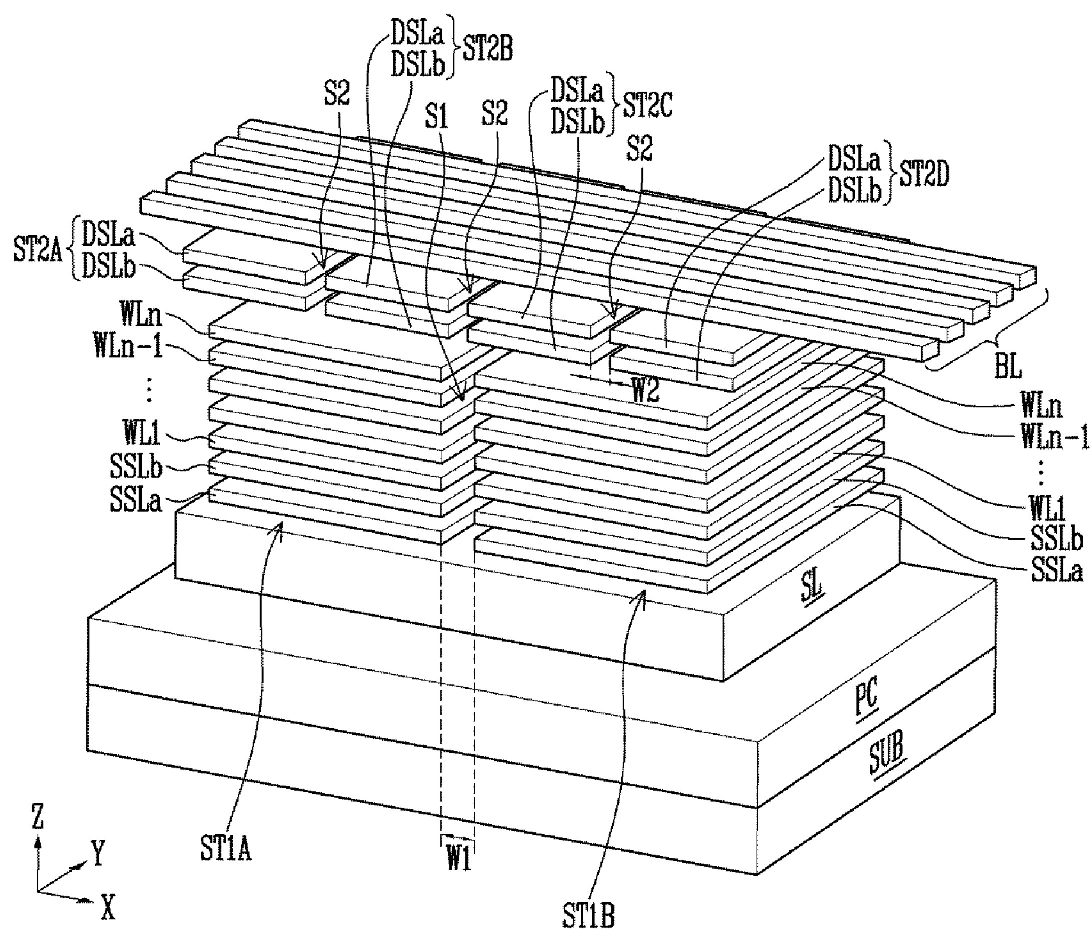
FIGS. 5A and 5B are perspective views schematically illustrating semiconductor memory devices according to embodiments of the present disclosure.
Figure 5B:
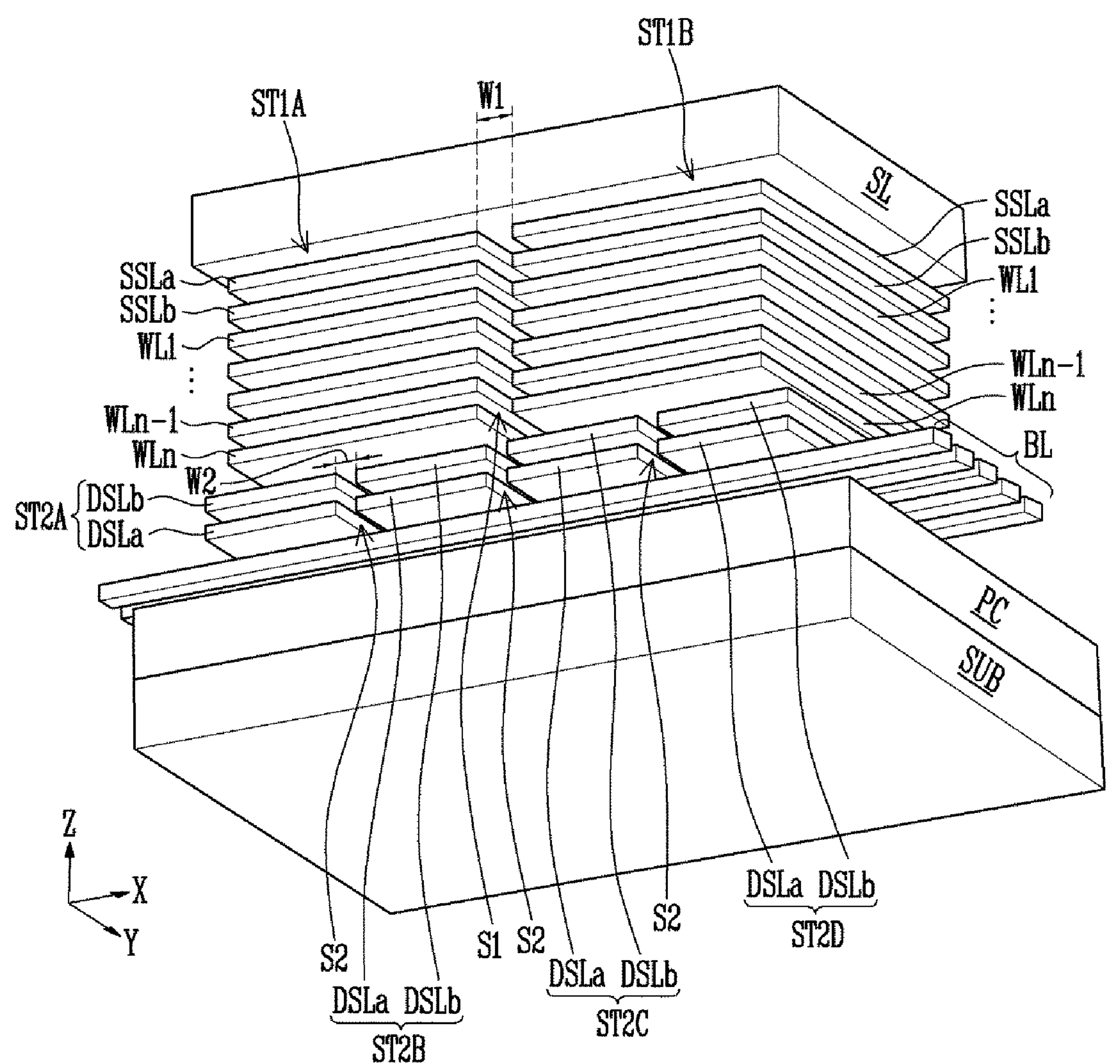

FIGS. 5A and 5B are perspective views schematically illustrating semiconductor memory devices according to embodiments of the present disclosure.

Referring to FIGS. 5A and 5B, each of the semiconductor memory devices may include a peripheral circuit PC, first stacked bodies ST1A and ST1B, second stacked bodies ST2A, ST2B, ST2C, and ST2D, bit lines BL, and a source layer SL which are disposed on a substrate SUB.

The substrate SUB may extend in a first direction X and a second direction Y. The first direction X may be a direction in which an X axis in an XYZ coordinate system faces, and the second direction Y may be a direction in which a Y axis in the XYZ coordinate system faces.

The peripheral circuit PC may include a voltage generator 31, a row decoder 33, a control circuit 35, and a page buffer group 37, illustrated in FIG. 1.

The first stacked bodies ST1A and ST1B may be separated from each other by a first slit S1. Each of the first stacked bodies ST1A and ST1B may include one or more source select lines SSLa and SSLb and a plurality of word lines WL1 to WLn which are stacked to be spaced apart from each other in a third direction Z. The source select lines SSLa and SSLb and the plurality of word lines WL1 to WLn may be implemented using first conductive patterns CP1 illustrated in FIG. 3.

The second stacked bodies ST2A, ST2B, ST2C, and ST2D may be separated from each other at the same level by second slits S2. In the third direction Z, the stack height of each of the second stacked bodies ST2A, ST2B, ST2C, and ST2D may be formed to be less than the stack height of each of the first stacked bodies ST1A and ST2B. Accordingly, the length of each of the second slits S2 in the third direction Z may be formed to be shorter than the length of the first slit S1. Although the width of the second slits S2 is controlled to be narrow, the second slits S2 have a relatively short length, and thus the second slits S2 may be stably formed. In an embodiment, the width W2 of each of the second slits S2 may be formed to be narrower than the width W1 of the first slit S1.

Each of the first slit S1 and the second slits S2 may extend in a linear shape, a zigzag shape, or a wave shape. The width of each of the first slit S1 and the second slits S2 may be changed in various forms depending on a design rule.

In an embodiment, two second stacked bodies ST2A and ST2B which are separated at the same level may overlap the first stacked body ST1A, and two second stacked bodies ST2C and ST2D which are separated at the same level may overlap the first stacked body ST1B. Embodiments of the present disclosure are not limited thereto. In an embodiment, three or more second stacked bodies which are separated at the same level may overlap each of the first stacked bodies ST1A and ST1B.

Each of the second stacked bodies ST2A, ST2B, ST2C, and ST2D may include two or more drain select lines DSLa and DSLb which are arranged to be spaced apart from each other in a third direction Z. The drain select lines DSLa and DSLb may be implemented using the second conductive patterns CP2 illustrated in FIG. 3.

The source layer SL may come into contact with first channel layers CL1, described above with reference to FIG. 3. The first channel layers CL1, described above with reference to FIG. 3, may penetrate the first stacked bodies ST1A and ST1B, respectively. The source layer SL may include a doped semiconductor layer. In an embodiment, the source layer SL may include an n-type doped silicon layer.

The bit lines BL may be electrically coupled to the capping pattern CAP and the second channel layer CL2, described above with reference to FIG. 3. Although not illustrated in the drawings, the capping pattern CAP and the second channel layer CL2 may be electrically coupled to the bit lines BL via contact plugs. The bit lines BL may be formed of various conductive materials.

The first stacked bodies ST1A and ST2B and the second stacked bodies ST2A, ST2B, ST2C, and ST2D may be disposed between the source layer SL and the bit lines BL. The source layer SL may overlap the second stacked bodies ST2A, ST2B, ST2C, and ST2D, with the first stacked bodies ST1A and ST2B interposed between the source layer SL and the second stacked bodies ST2A, ST2B, ST2C, and ST2D. The bit lines BL may overlap the first stacked bodies ST1A and ST1B, with the second stacked bodies ST2A, ST2B, ST2C, and ST2D interposed between the bit lines BL and the first stacked bodies ST1A and ST1B.

Although not illustrated in the drawings, the bit lines BL, the source layer SL, the source select lines SSLa and SSLb, the plurality of word lines WL1 to WLn, and the drain select lines DSLa, DSLb may be electrically coupled to the peripheral circuit PC through various types of interconnections.

The plurality of word lines WL1 to WLn may overlap the source select lines SSLa and SSLb. The drain select lines DSLa and DSLb may overlap the source select lines SSLa and SSLb, with the plurality of word lines WL1 to WLn interposed between the drain select lines DSLa and DSLb and the source select lines SSLa and SSLb.

Referring to FIG. 5A, in an embodiment, the peripheral circuit PC may overlap the second stacked bodies ST2A, ST2B, ST2C, and ST2D, with the source layer SL and the first stacked bodies ST1A and ST1B interposed between the peripheral circuit PC and the second stacked bodies ST2A, ST2B, ST2C, and ST2D.

Referring to FIG. 5B, as an embodiment, the peripheral circuit PC may overlap the first stacked bodies ST1A and ST1B, with the bit lines BL and the second stacked bodies ST2A, ST2B, ST2C, and ST2D interposed between the peripheral circuit PC and the first stacked bodies ST1A and ST1B.

Figure 6:
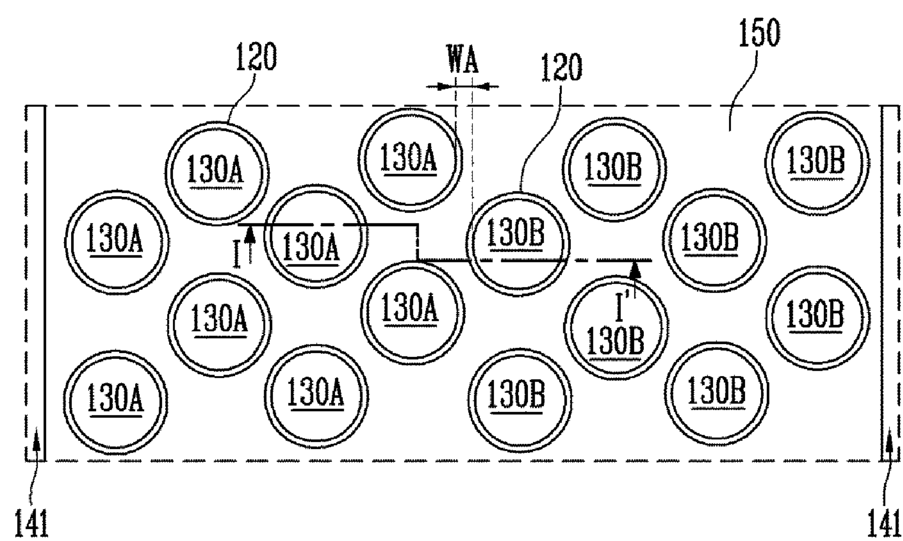
FIG. 6 is a plan view illustrating a lower stacked body according to an embodiment of the present disclosure.

FIG. 6 is a plan view illustrating a lower stacked body 150 according to an embodiment of the present disclosure.

Referring to FIG. 6, the lower stacked body 150 may be penetrated by a plurality of first channel structures 130A and 130B. The lower stacked body 150 may remain in an area partitioned by first slits 141. A sidewall of each of the first channel structures 130A and 130B may be surrounded by a memory layer 120.

The first channel structures 130A and 130B may be arranged in a plurality of columns and a plurality of rows. In an embodiment, the first channel structures 130A and 130B may be arranged in zigzags. Embodiments of the present disclosure are not limited thereto. In an embodiment, the first channel structures 130A and 130B may be arranged in parallel with each other in a row direction and a column direction.

The first channel structures 130A and 130B may be divided into a plurality of groups. In an embodiment, the first channel structures 130A and 130B may include first channel structures 130A of a first group and first channel structures 130B of a second group.

Figure 7A:
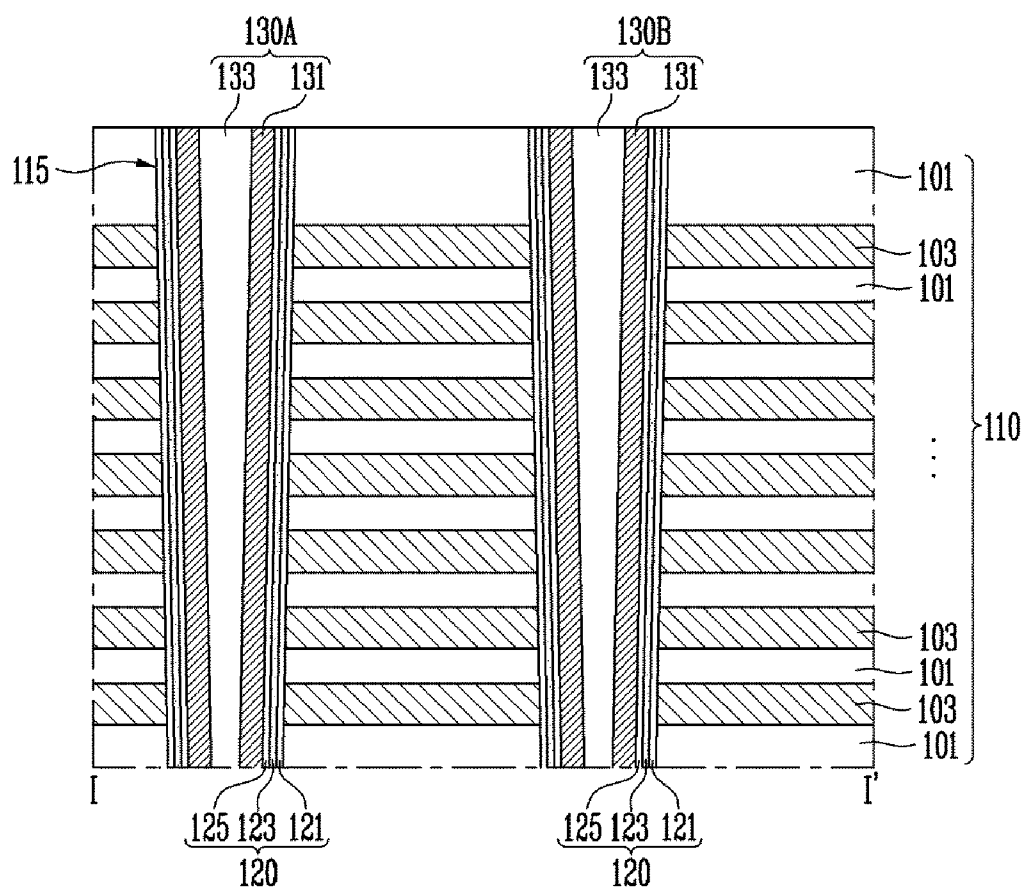
FIGS. 7A, 7B, and 7C are sectional views illustrating the step of forming a lower stacked body according to an embodiment of the present disclosure.
Figure 7B:
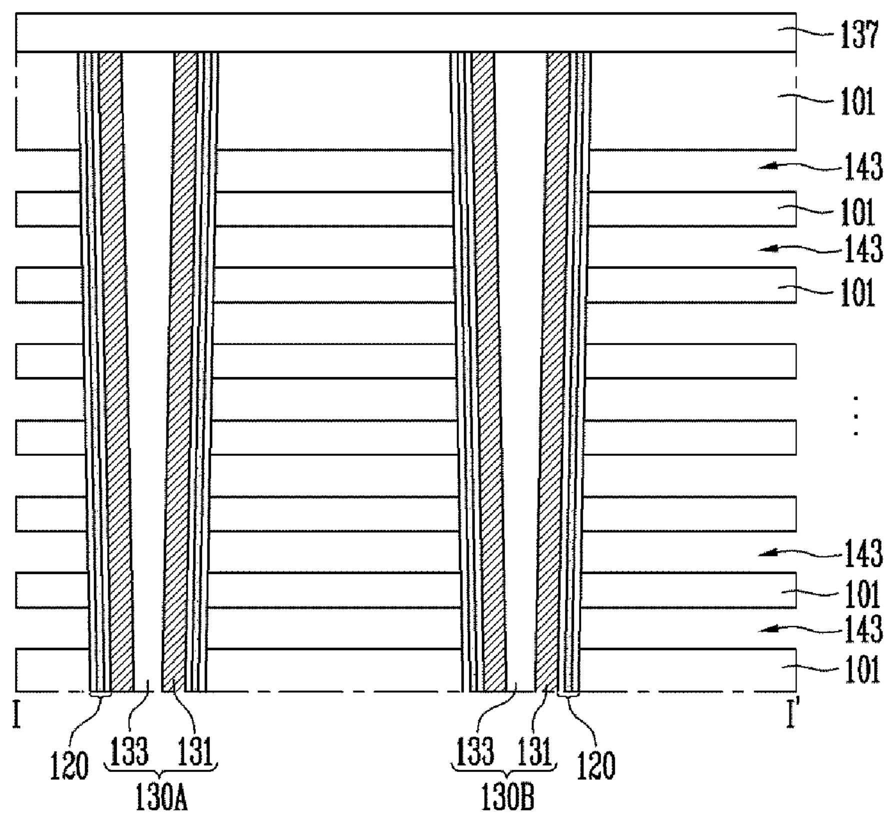
Figure 7C:
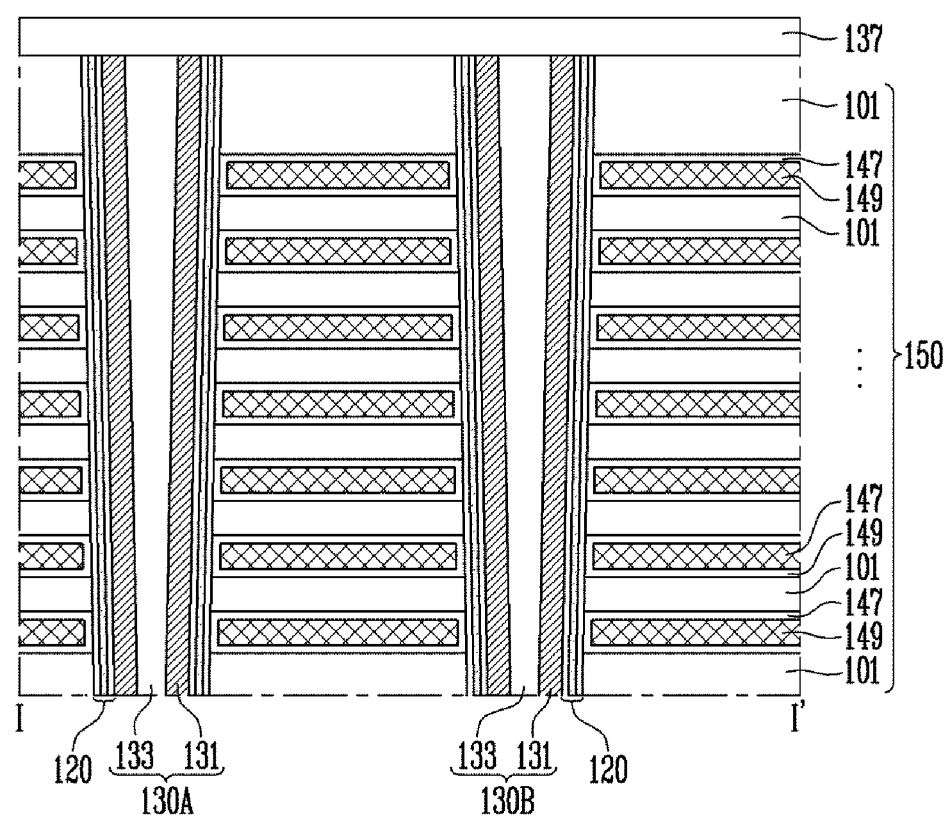

FIGS. 7A, 7B, and 7C are sectional views illustrating the step of forming the lower stacked body 150 according to an embodiment of the present disclosure. FIGS. 7A, 7B, and 7C are sectional views for respective processing steps taken along line I-I' of FIG. 6.

Referring to FIG. 7A, the step of forming the lower stacked body may include the step of forming a first preliminary stacked body 110, the step of forming first holes 115 passing through the first preliminary stacked body 110, the step of forming memory layers 120 on respective sidewalls of the first holes 115, and the step of forming first channel structures 130A and 130B filling central regions of the first holes 115 on the surfaces of the memory layers 120.

The first preliminary stacked body 110 may be formed on a source layer or on a substrate. The first preliminary stacked body 110 may include lower interlayer insulating layers 101 and first sacrificial layers 103 which are alternately stacked. Each of the first sacrificial layers 103 may include a material having etching selectivity to the lower interlayer insulating layers 101. In an embodiment, the lower interlayer insulating layers 101 may include silicon oxide, and the sacrificial layers 103 may include silicon nitride.

The first holes 115 may be formed by removing partial regions of the first preliminary stacked body 110 through an etching process by using a photoresist pattern (not illustrated), which is formed through a photolithography process, as an etch barrier. After the first holes 115 have been formed, the photoresist pattern may be removed.

The step of forming the memory layers 120 may include the step of sequentially forming a first blocking insulating layer 121, a data storage layer 123, and a tunnel insulating layer 125. The first blocking insulating layer 121, the data storage layer 123, and the tunnel insulating layer 125 may extend along the sidewall of each of the first holes 115.

The step of forming the first channel structures 130A and 130B may include the step of forming respective channel layers 131 on the memory layers 120, and the step of filling respective central regions of the first holes 115, opened by the channel layers 131, with first core insulating layers 133.

A part of each of the first blocking insulating layers 121, the data storage layers 123, the tunnel insulating layers 125, the channel layers 131, and the first core insulating layers 133 may be removed through a planarizing process. As a result, the first blocking insulating layers 121, the data storage layers 123, and the tunnel insulating layers 125 may remain as the memory layers 120 in the respective first holes 115. The channel layers 131 and the first core insulating layers 133 may be separated into the first channel structures 130A and 130B.

Each channel layer 131 may include an undoped semiconductor layer. In an embodiment, the channel layer 131 may include undoped silicon.

Referring to FIG. 7B, a first upper interlayer insulating layer 137 covering the first channel structures 130A and 130B may be formed on the first preliminary stacked body 110 illustrated in FIG. 7A.

The step of forming the lower stacked body may include the step of forming the first slits 141 illustrated in FIG. 6 and the step of selectively removing the first sacrificial layers 103 illustrated in FIG. 7A through the first slits 141. As a result, first gate regions 143 between the lower interlayer insulating layers 101 may be opened.

Referring to FIG. 7C, the step of forming the lower stacked body 150 may include the step of forming second blocking insulating layers 147 along respective surfaces of the first gate regions 143 illustrated in FIG. 7B, and the step of filling the gate regions 143, opened by the second blocking insulating layers 147, with first conductive patterns 149. The first conductive patterns 149 may extend to surround the first channel structures 130A of the first group and the first channel structures 130B of the second group.

The first conductive patterns 149 may be formed of various types of conductive materials. In an embodiment, each of the first conductive patterns 149 may include each of a metal silicide layer, a metal layer, and a doped silicon layer alone, or may include at least two of the metal silicide layer, the metal layer, and the doped silicon layer. Although not illustrated in the drawings, a metal barrier layer may be disposed between each first conductive pattern 149 and the corresponding second blocking insulating layer 147. The metal barrier layer may extend to space between each first conductive pattern 149 and the corresponding memory layer 120.

Figure 8:
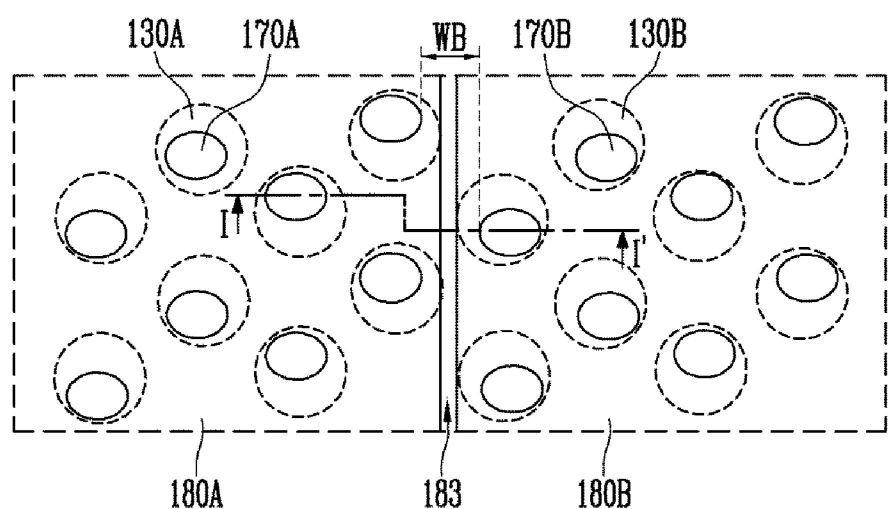
FIG. 8 is a plan view illustrating upper stacked bodies according to an embodiment of the present disclosure.

FIG. 8 is a plan view illustrating upper stacked bodies 180A and 180B according to an embodiment of the present disclosure.

Referring to FIG. 8, the upper stacked bodies 180A and 180B may include a first upper stacked body 180A overlapping first channel structures 130A of a first group and a second upper stacked body 180B overlapping first channel structures 130B of a second group. The first upper stacked body 180A and the second upper stacked body 180B may be separated from each other by a second slit 183.

The first upper stacked body 180A may extend to surround second channel structures 170A of a first group, and the second upper stacked body 180B may extend to surround second channel structures 170B of a second group. The second channel structures 170A of the first group may respectively overlap the first channel structures 130A of the first group, and the second channel structures 170B of the second group may respectively overlap the first channel structures 130B of the second group.

In order to secure arrangement space for the second slit 183, an interval WB between the second channel structure 170A of the first group and the second channel structure 170B of the second group, which neighbor each other, may be formed to be greater than an interval WA between the first channel structure 130A of the first group and the first channel structure 130B of the second group, which neighbor each other, as illustrated in FIG. 6. In an embodiment, in order to secure the interval WB between the second channel structure 170A of the first group and the second channel structure 170B of the second group, the diameter of each of the second channel structures 170A and 170B may be formed to be less than that of each of the first channel structures 130A and 130B.

FIGS. 9A, 9B, 9C, 9D, and 9E are sectional views illustrating the step of forming upper stacked bodies 180A and 180B according to an embodiment of the present disclosure. FIGS. 9A, 9B, 9C, 9D, and 9E are sectional views taken along line I-I' of FIG. 8.

Figure 9A:
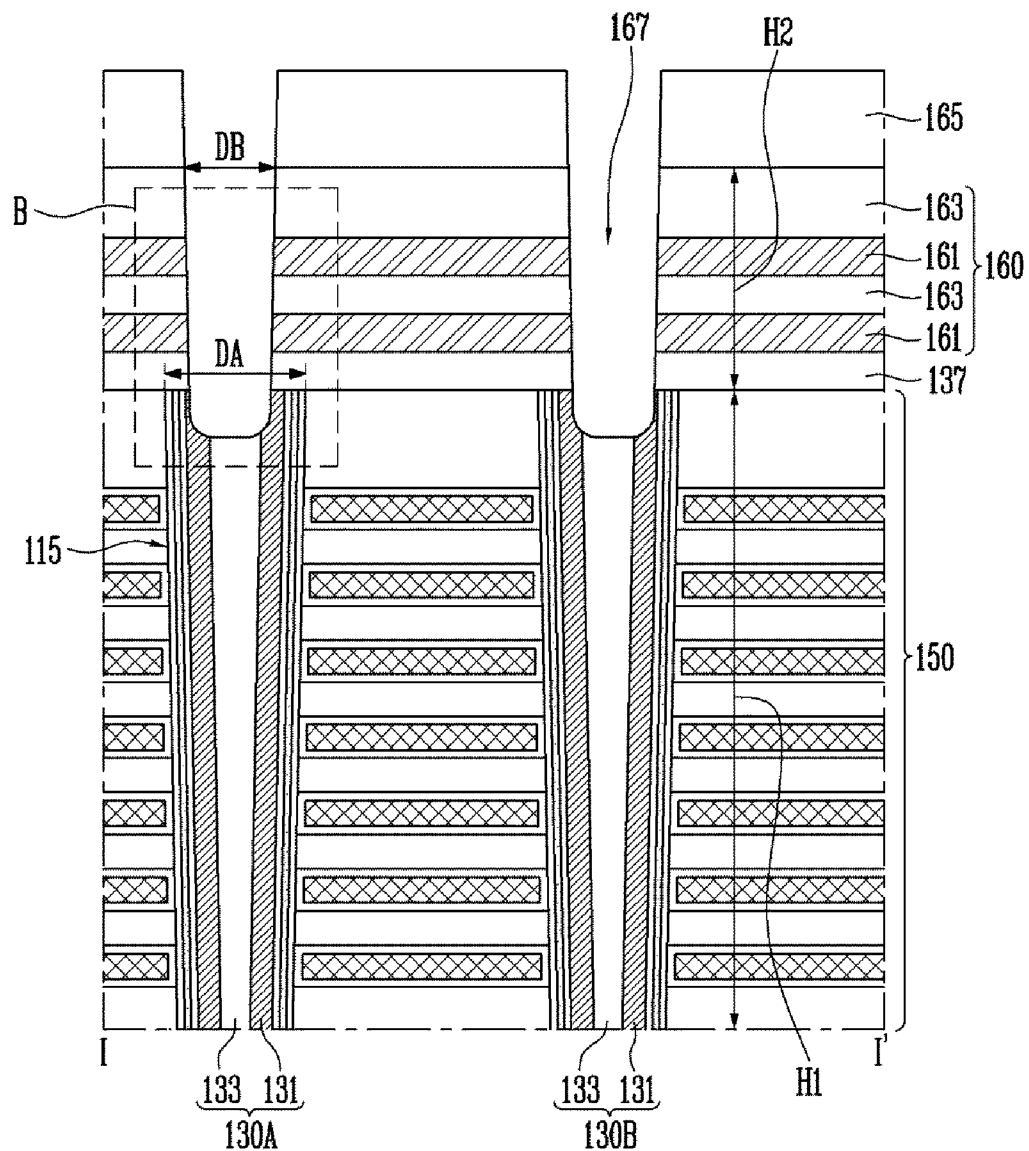
FIGS. 9A, 9B, 9C, 9D, and 9E are sectional views illustrating the step of forming upper stacked bodies according to an embodiment of the present disclosure.

Referring to FIG. 9A, the step of forming the upper stacked bodies may include the step of forming a second preliminary stacked body 160 and the step of forming second holes 167 passing through the second preliminary stacked body 160. The second preliminary stacked body 160 may overlap a lower stacked body 150 extending to surround first channel structures 130A of a first group and first channel structures 130B of a second group. The second holes 167 may overlap the first channel structures 130A of the first group and the first channel structures 130B of the second group. The second holes 167 may pass through a first upper interlayer insulating layer 137 to expose the first channel structures 130A of the first group and the first channel structures 130B of the second group.

The second preliminary stacked body 160 may include second sacrificial layers 161 and second upper interlayer insulating layers 163, which are alternately stacked on the first upper interlayer insulating layer 137. Each of the second sacrificial layers 161 may include a material having etching selectivity to the first upper interlayer insulating layer 137 and the second upper interlayer insulating layers 163. In an embodiment, the first upper interlayer insulating layer 137 and the second upper interlayer insulating layers 163 may include silicon oxide, and the second sacrificial layers 161 may include silicon nitride.

The step of forming the second holes 167 may include the step of forming a photoresist pattern 165 through a photolithography process and the step of removing partial regions of the second preliminary stacked body 160 and partial regions of the first upper interlayer insulating layer 137 through an etching process by using the photoresist pattern 165 as an etch barrier. The second holes 167 may expose respective channel layers 131 of the first channel structures 130A of the first group and of the first channel structures 130B of the second group.

The total stack height H2 of the first upper interlayer insulating layer 137 and the second preliminary stacked body 160 is lower than the stack height H1 of the lower stacked body 150. Therefore, even if each of the second holes 167 is formed at a depth less than that of the first holes 115, the channel layers 131 may be exposed through the second holes 167. An upper diameter DB of each of the second holes 167 formed at a small depth may be controlled to be narrow. In an embodiment, the upper diameter DB of each of the second holes 167 may be formed to be narrower than the upper diameter DA of each of the first holes 115.

The photoresist pattern 165 may be removed after the second holes 167 have been formed.

Figure 9B:
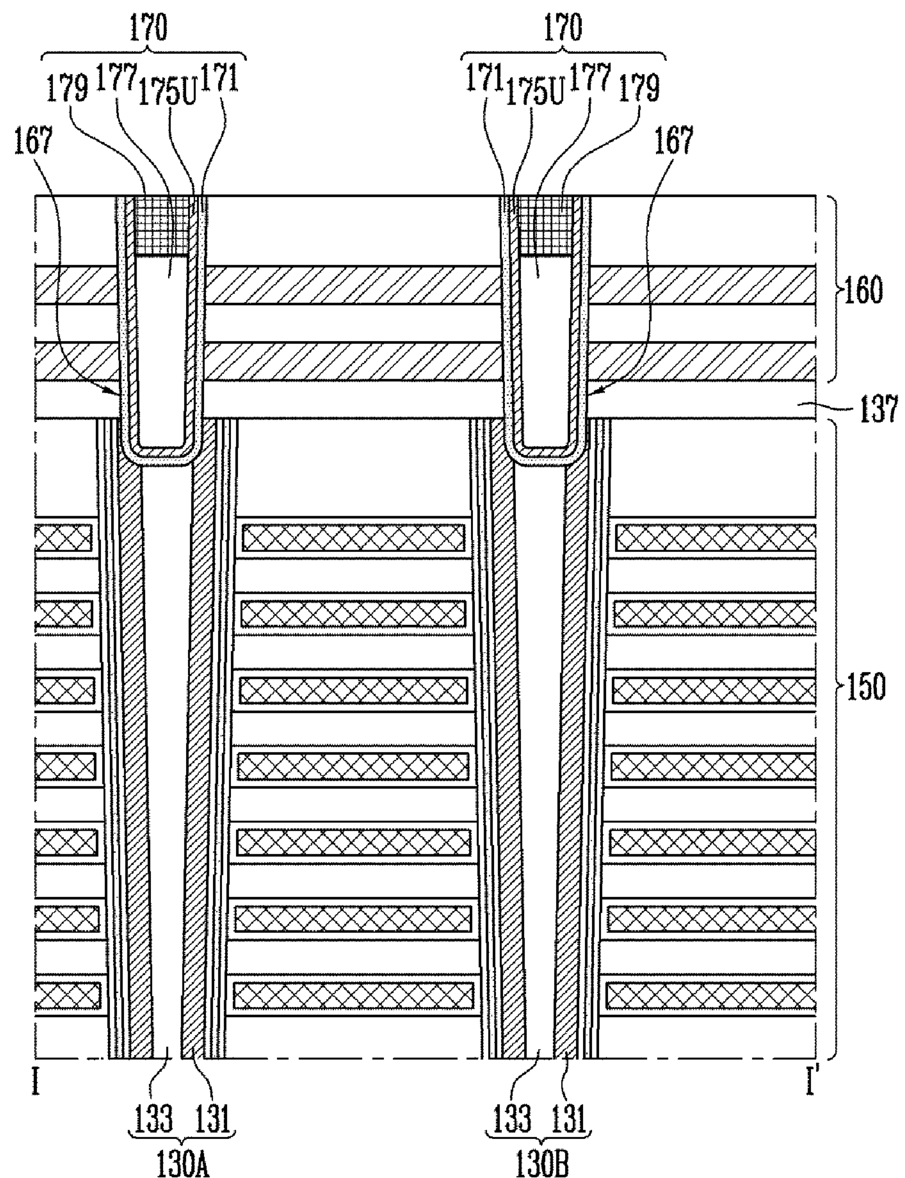

Referring to FIG. 9B, the step of forming the upper stacked bodies may include the step of forming preliminary channel structures 170 in the second holes 167. Each of the preliminary channel structures 170 may include a preliminary doped semiconductor pattern 171, an undoped semiconductor pattern 175U, a second core insulating layer 177, and a capping pattern 179.

The preliminary doped semiconductor pattern 171 may be formed on the surface that defines each of the second holes 167. The preliminary doped semiconductor pattern 171 may come into contact with the corresponding channel layer 131.

The undoped semiconductor pattern 175U may be formed on the preliminary doped semiconductor pattern 171, and may extend along the surface that defines each of the second holes 167. The second core insulating layer 177 and the capping pattern 179 may fill a central region of the corresponding second hole 167 exposed through the undoped semiconductor pattern 175U. The capping pattern 179 may overlap the corresponding first core insulating layer 133, with the second core insulating layer 177 interposed therebetween.

Figure 9C:
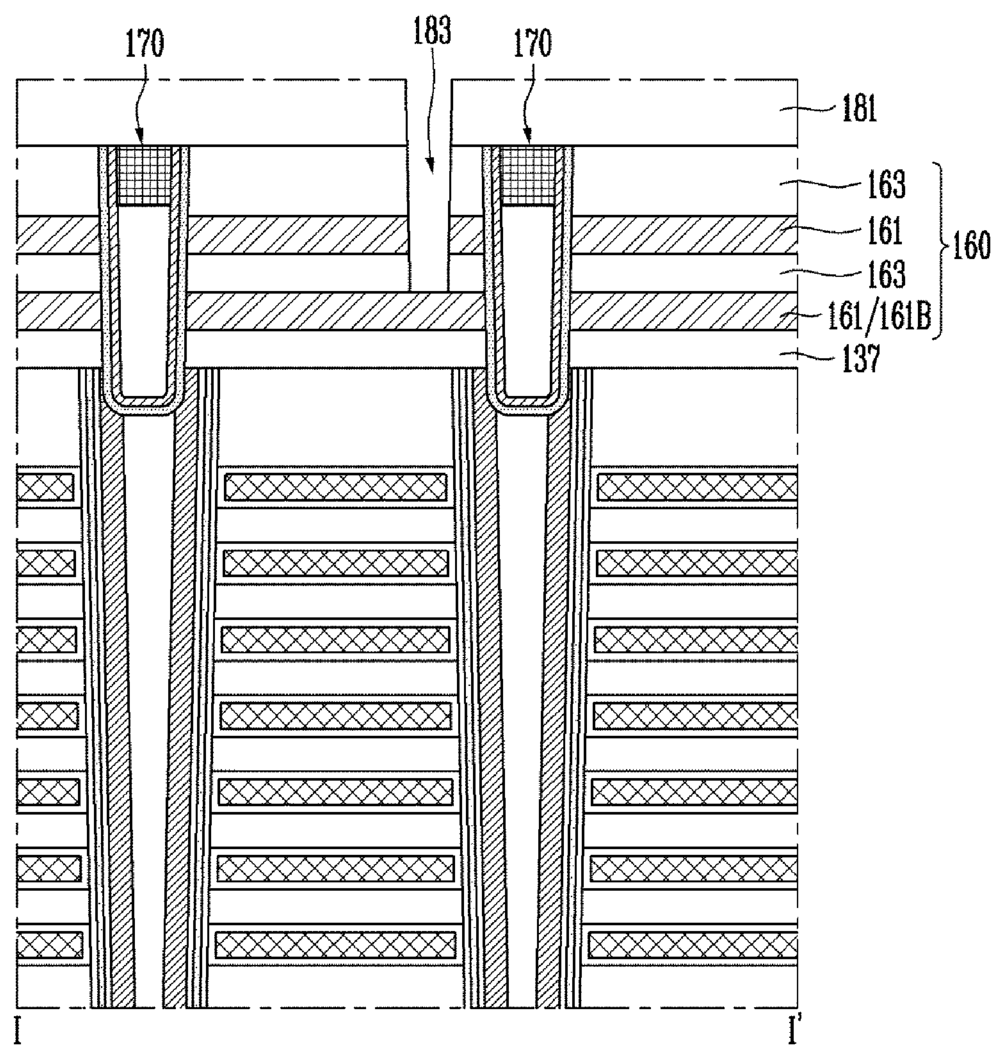

Referring to FIG. 9C, a third upper interlayer insulating layer 181 may be formed on the second preliminary stacked body 160. The third upper interlayer insulating layer 181 may extend to cover preliminary channel structures 170.

The step of forming the upper stacked bodies may include the step of forming a second slit 183 passing through the third upper interlayer insulating layer 181 and the second preliminary stacked body 160. The second slit 183 may be formed at the depth at which a second sacrificial layer 161B in the lowest layer, among second sacrificial layers 161, is exposed. In this way, the width of the second slit 183 may be minimized.

Figure 9D:
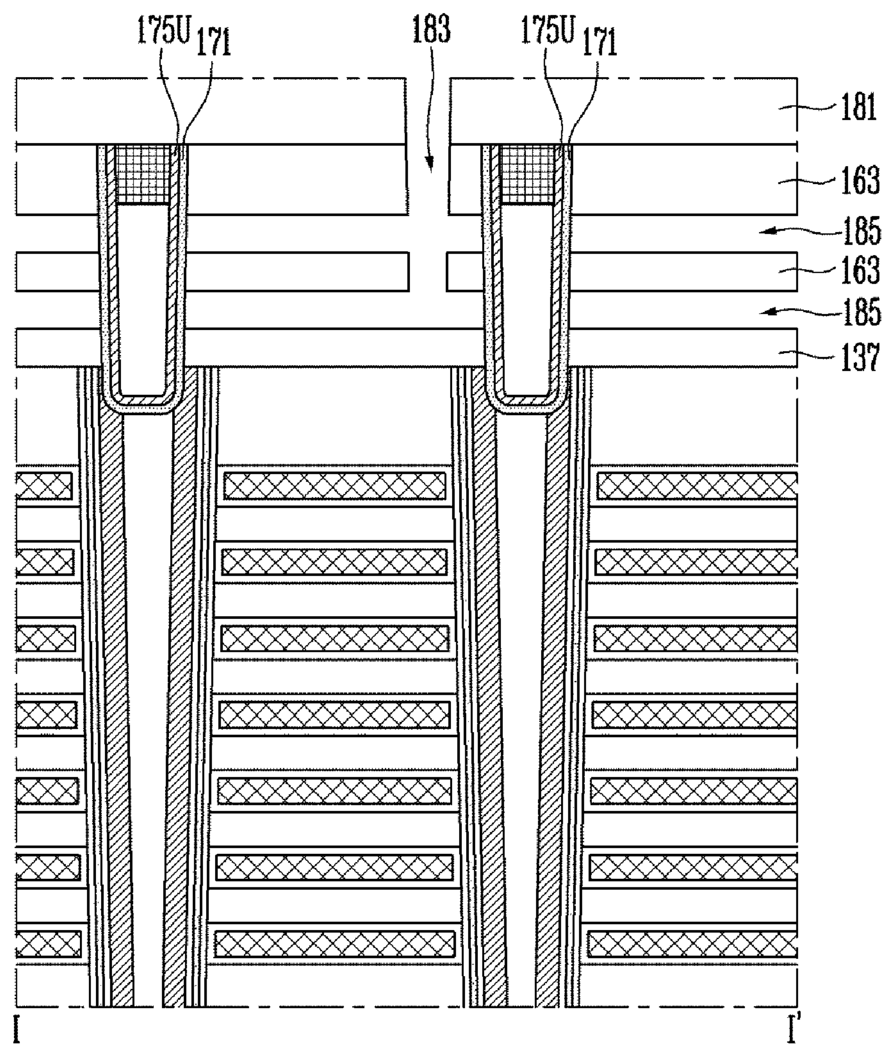

Referring to FIG. 9D, the step of forming the upper stacked bodies may include the step of selectively removing the second sacrificial layers 161, illustrated in FIG. 9C, through the second slit 183. Therefore, second gate regions 185 may be opened between the first upper interlayer insulating layer 137 and the second upper interlayer insulating layer 163, which neighbor each other, and between the second upper interlayer insulating layers 163, which neighbor each other.

The preliminary doped semiconductor pattern 171 of each of the preliminary channel structures 170 may be exposed by the second gate regions 185.

Figure 9E:
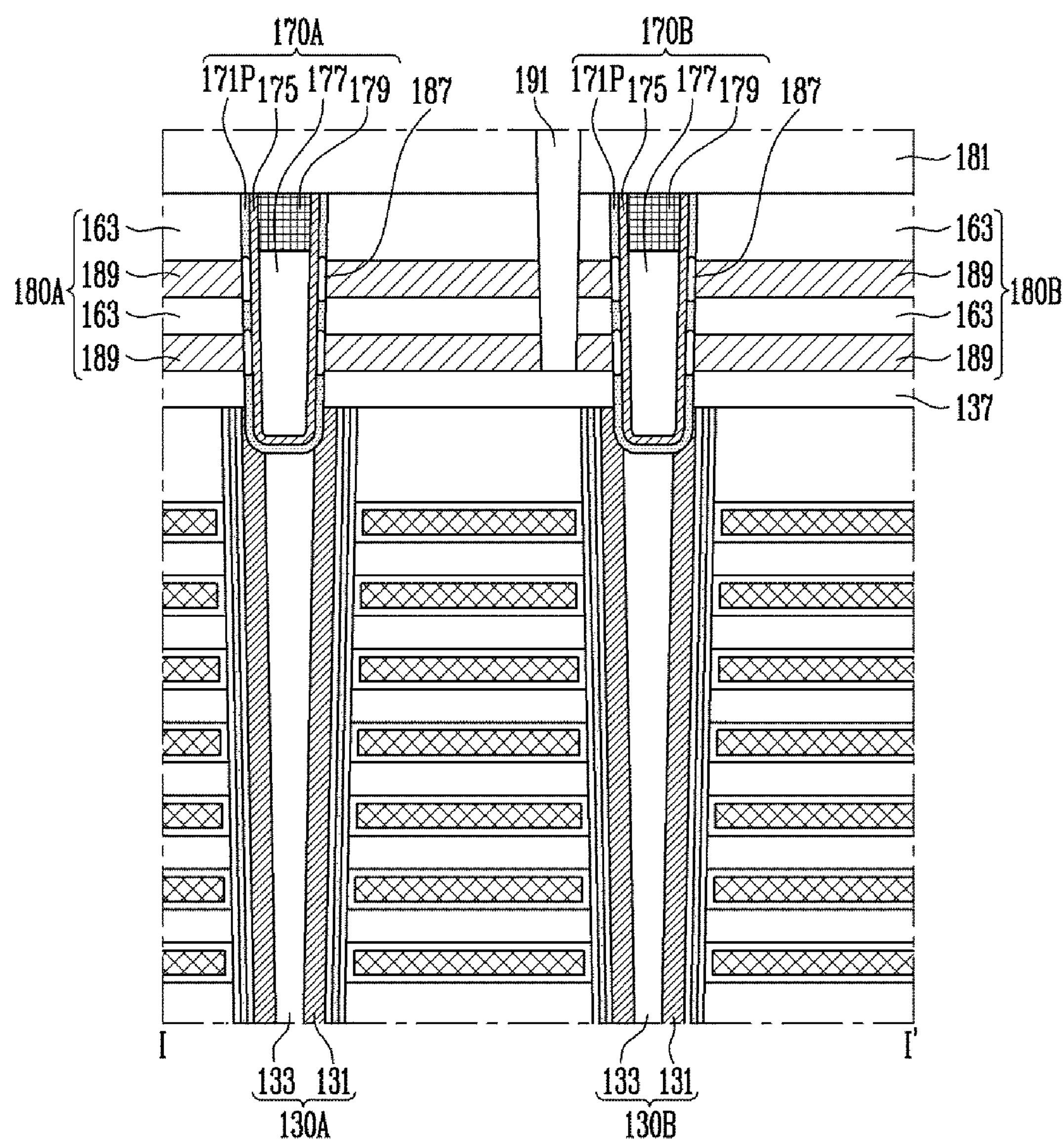

Referring to FIG. 9E, gate insulating layers 187 may be formed by oxidizing parts of the preliminary doped semiconductor patterns 171 illustrated in FIG. 9D through the second gate regions 185 illustrated in FIG. 9D. Non-oxidized regions of the preliminary doped semiconductor patterns 171 may remain as doped semiconductor patterns 171P.

Thereafter, semiconductor patterns 175, each including undoped areas and doped areas, may be formed by diffusing dopants of the doped semiconductor patterns 171P and the capping patterns 179 to the undoped semiconductor patterns 175U, illustrated in FIG. 9D. In this way, second channel structures 170A of a first group and second channel structures 170B of a second group may be defined.

Each of the second channel structures 170A of the first group and the second channel structures 170B of the second group may include doped semiconductor patterns 171P, the semiconductor pattern 175 including undoped areas surrounded by gate insulating layers 187, the second core insulating layer 177, and the capping pattern 179.

The step of forming the upper staked bodies 180A and 180B may include the step of filling the second gate regions 185, illustrated in FIG. 9D, with second conductive patterns 189. Each of the second conductive patterns 189 may include each of a metal silicide layer, a metal layer, and a doped silicon layer alone, or may include at least two of the metal silicide layer, the metal layer, and the doped silicon layer. The second conductive patterns 189 may extend to surround the gate insulating layers 187.

Then, the second slit 183, illustrated in FIG. 9D, may be filled with an insulating material 191.

FIGS. 10A, 10B, 10C, 10D, 10E, and 10F are enlarged sectional views illustrating the step of forming an upper stacked body according to an embodiment of the present disclosure.

Figure 10A:
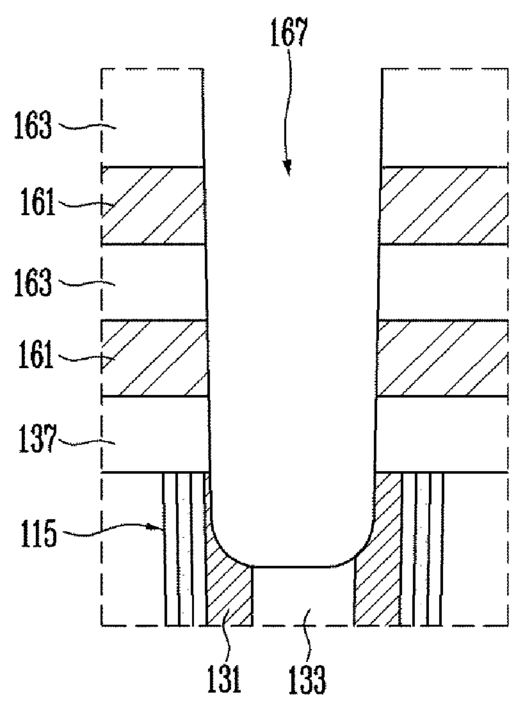
FIGS. 10A, 10B, 10C, 10D, 10E, and 10F are enlarged sectional views illustrating the step of forming an upper stacked body according to an embodiment of the present disclosure.

FIG. 10A is an enlarged sectional view of region B illustrated in FIG. 9A.

Referring to FIG. 10A, a second hole 167 may pass through a first upper interlayer insulating material 137, second sacrificial layers 161, and second upper interlayer insulating layers 163, which overlap a channel layer 131. The second hole 167 may extend to the inside of a first hole 115.

Figure 10B:
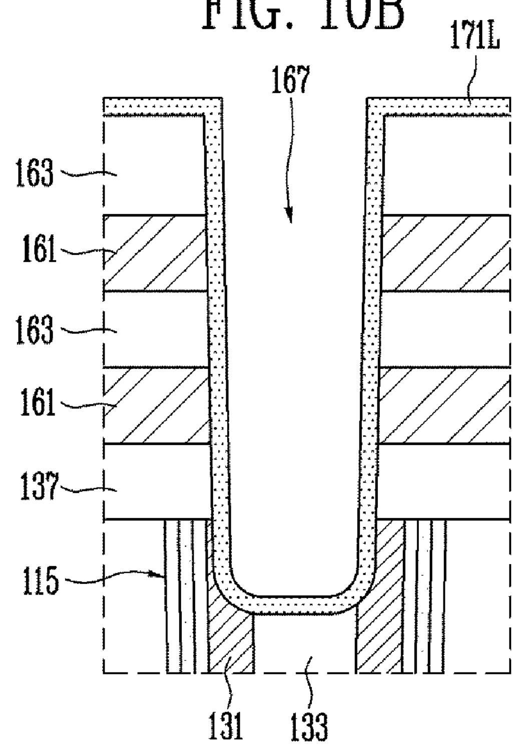
Figure 10C:
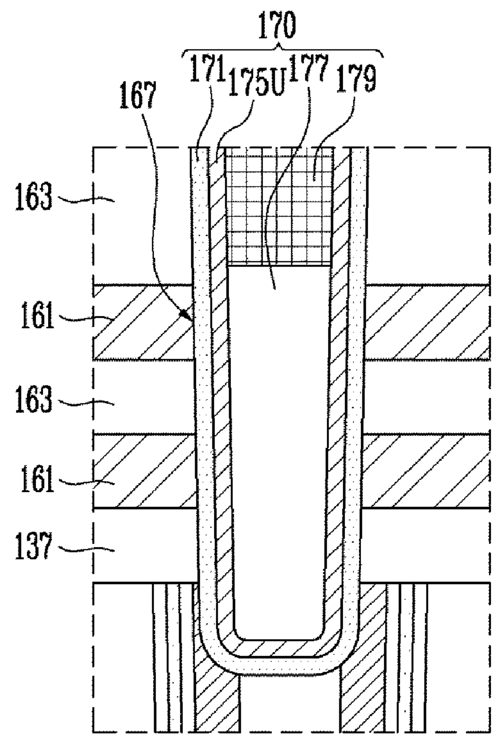

FIGS. 10B and 10C are enlarged sectional views illustrating an embodiment of the step of forming the preliminary channel structure 170.

Referring to FIG. 10B, the step of forming the preliminary channel structure may include the step of forming a doped semiconductor layer 171L on the surface that defines the second hole 167. In an embodiment, the doped semiconductor layer 171L may include an n-type silicon layer.

The doped semiconductor layer 171L may be deposited using silicon source gas and impurity gas including dopants. As described above with reference to FIG. 9A, the depth of the second hole 167 is formed to be relatively small, and thus it is easy to uniformly form the doped semiconductor layer 171L along the surface that defines the second hole 167.

Referring to FIG. 10C, an undoped semiconductor layer is deposited on the doped semiconductor layer 171L illustrated in FIG. 10B, after which the central region of the second hole 167 may be filled with a second core insulating layer 177. Next, the top of the second hole 167 may be opened by removing a part of the second core insulating layer 177, and the opened top of the second hole 167 may be filled with a capping layer.

In an embodiment, the undoped semiconductor layer may include undoped silicon. In an embodiment, the capping layer may include a semiconductor material doped with dopants of a same type as the doped semiconductor layer 171L. In an embodiment, the capping layer may include n-type doped silicon.

Respective parts of the capping layer, the undoped semiconductor layer, and the doped semiconductor layer 171L, illustrated in FIG. 10B, may be removed using a planarization process. The planarization process may be performed such that a top surface of a second interlayer insulating layer 163 is exposed. In this way, the capping layer may remain as a capping pattern 179, the undoped semiconductor layer may remain as an undoped semiconductor pattern 175U, and the doped semiconductor layer 171L may remain as a preliminary doped semiconductor pattern 171.

Figure 10D:
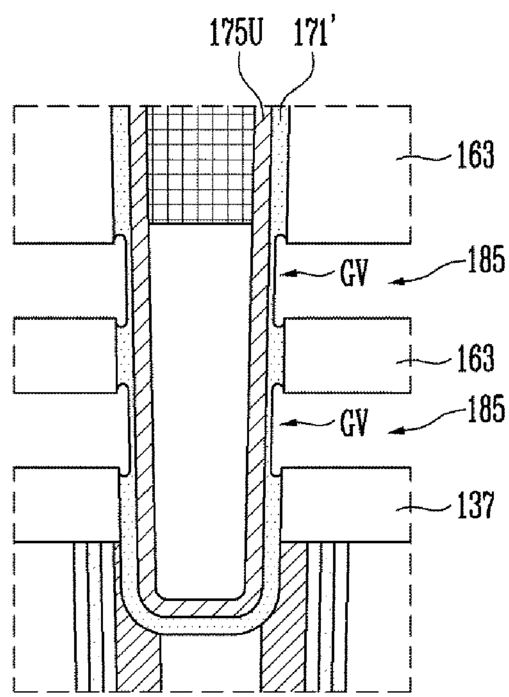
Figure 10E:
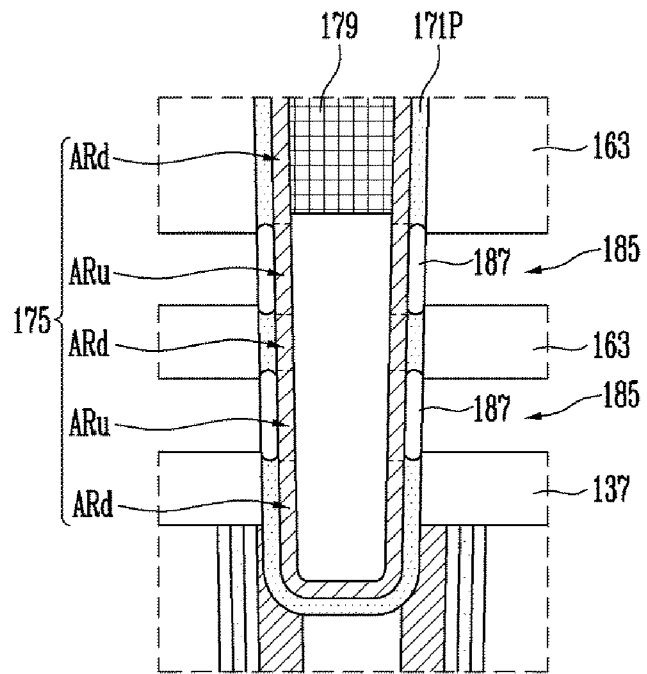

FIGS. 10D and 10E are enlarged sectional views illustrating an embodiment of the step of forming the gate insulating layers 187 and an embodiment of the step of forming the semiconductor pattern 175.

Referring to FIG. 10D, second gate regions 185 may be opened through the processes described above with reference to FIGS. 9C and 9D.

Then, a part of the preliminary doped semiconductor 171, illustrated in FIG. 10C, may be removed through the second gate regions 185. In this way, a preliminary doped semiconductor pattern 171' having a sidewall in which grooves GV are formed may be defined.

Referring to FIG. 10E, gate insulating layers 187 may be formed by oxidizing the preliminary doped semiconductor pattern 171' from the surface of the preliminary doped semiconductor pattern 171' exposed through the grooves GV illustrated in FIG. 10D. Non-oxidized regions of the preliminary doped semiconductor pattern 171' may remain as doped semiconductor patterns 171P.

Even if the thickness of the gate insulating layers 187 has increased during the above-described oxidization process, space dedicated to the gate insulating layers 187 within the second gate regions 185 may be reduced through the grooves GV illustrated in FIG. 10D.

The oxidization process may be controlled such that the doped semiconductor patterns 171P remain between the first upper interlayer insulating layer 137 and the undoped semiconductor pattern 175U, illustrated in FIG. 10D, and between the second upper interlayer insulating layers 163 and the undoped semiconductor pattern 175U, illustrated in FIG. 10D. The oxidization process may be controlled such that the gate insulating layers 187 come into contact with the undoped semiconductor pattern 175U, illustrated in FIG. 10D. In this way, the doped semiconductor patterns 171P may be separated from each other by the gate insulating layers 187.

After the gate insulating layers 187 have been formed, dopants of the doped semiconductor patterns 171P and dopants of the capping pattern 179 may be diffused into the undoped semiconductor pattern 175U, illustrated in FIG. 10D. As a result, a semiconductor pattern 175 including doped areas ARd and undoped areas ARu may be defined. The doped areas ARd may come into contact with the doped semiconductor patterns 171P and the capping pattern 179, respectively, and the undoped areas ARu may be surrounded by the gate insulating layers 187, respectively.

Figure 10F:
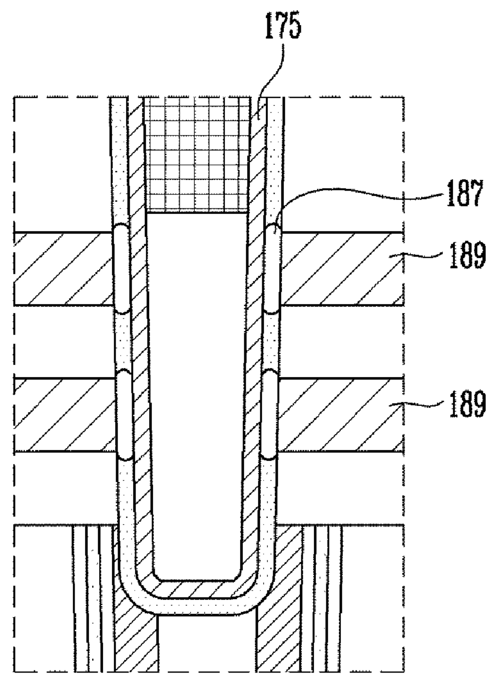

FIG. 10F is an enlarged sectional view illustrating the second conductive patterns 189.

Referring to FIG. 10F, the second gate regions 185, illustrated in FIG. 10E, may be filled with the second conductive patterns 189. As described above with reference to FIG. 10E, when the space dedicated to the gate insulating layers 187 within the second gate regions 185 is reduced, space occupied by the second conductive patterns 189 within the second gate regions 185 may be increased.

Figure 11:
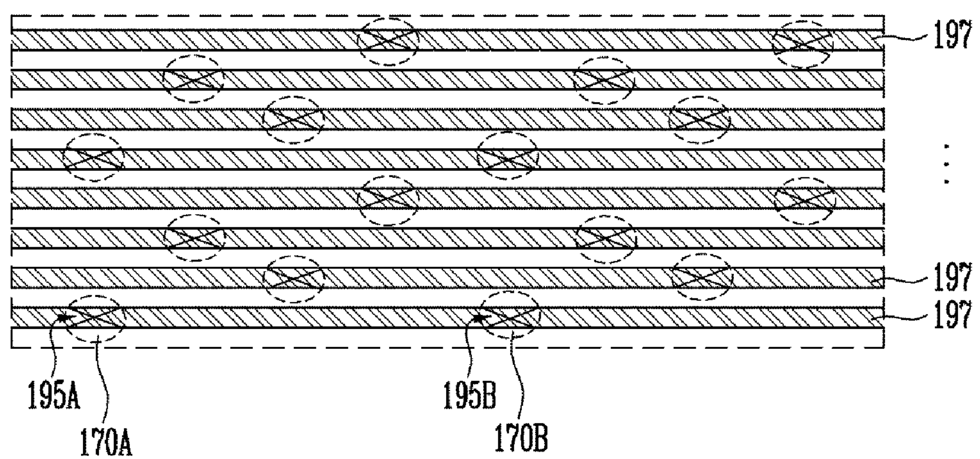
FIG. 11 is a plan view illustrating bit lines according to an embodiment of the present disclosure.

FIG. 11 is a plan view illustrating bit lines 197 according to an embodiment of the present disclosure.

Referring to FIG. 11, the bit lines 197 may be formed on the third upper interlayer insulating layer 181 illustrated in FIG. 9E. The bit lines 197 may be coupled to a pair of second channel structures of a first group and a second group which correspond to each bit line 197, that is, the second channel structure 170A of the first group and the second channel structure 170B of the second group, via a first contact plug 195A and a second contact plug 195B which penetrate the third interlayer insulating layer 181, illustrated in FIG. 9E.

FIGS. 12A, 12B, 12C, and 12D are enlarged sectional views illustrating the step of forming an upper stacked body according to an embodiment of the present disclosure.

Figure 12A:
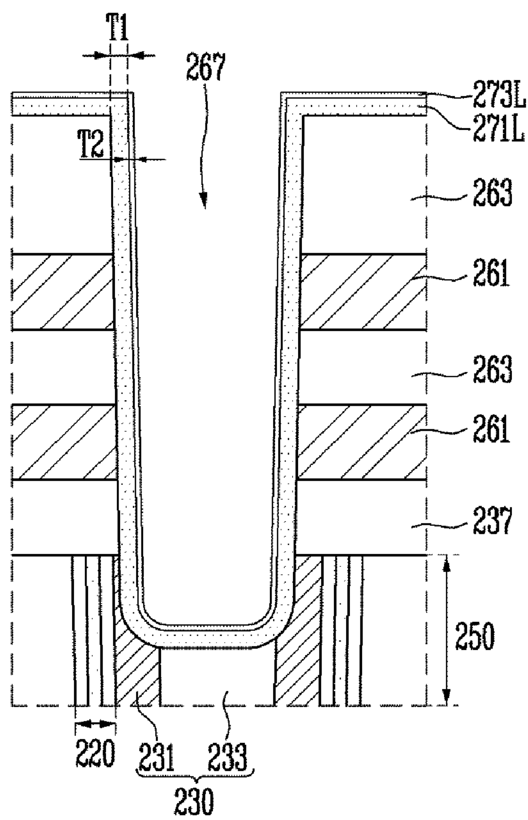
FIGS. 12A, 12B, 12C, and 12D are enlarged sectional views illustrating the step of forming an upper stacked body according to an embodiment of the present disclosure.

Referring to FIG. 12A, a first stacked body 250 extending to surround a first channel structure 230 may be formed using processes described above with reference to FIGS. 7A, 7B, and 7C. In accordance with the processes described above with reference to FIGS. 7A, 7B, and 7C, a memory layer 220 may be disposed between the first channel structure 230 and the first stacked body 250, and the first channel structure 230 may include a channel layer 231 and a first core insulating layer 233.

After a first upper interlayer insulating layer 237 has been formed on the above-described first stacked body 250, sacrificial layers 261 and second upper interlayer insulating layers 263 may be alternately stacked on the first upper interlayer insulating layer 237. Then, a hole 267 passing through the first upper interlayer insulating layer 237, the sacrificial layers 261, and the second upper interlayer insulating layers 263 which overlap the first channel structure 230 may be formed. The hole 267 may extend to the inside of the first core insulating layer 233, and may expose the channel layer 231.

Thereafter, a doped semiconductor layer 271L may be formed on the surface that defines the hole 267 using the process, described above with reference to FIG. 10B. Next, a barrier layer 273L may be formed on the doped semiconductor layer 271L. The thickness T2 of the barrier layer 273L may be controlled to be less than the thickness T1 of the doped semiconductor layer 271L. In an embodiment, the thickness T2 of the barrier layer 273L may be controlled to be less than or equal to 30A.

In an embodiment, the barrier layer 273L may include an oxide layer. In an embodiment, the oxide layer may be a native oxide layer formed on the surface of the doped semiconductor layer 271L. The native oxide layer may remain as the barrier layer 273L because a cleaning process is omitted after the doped semiconductor layer 271L has been formed. The native oxide layer may be formed at a thickness less than that of the doped semiconductor layer 271L.

Figure 12B:
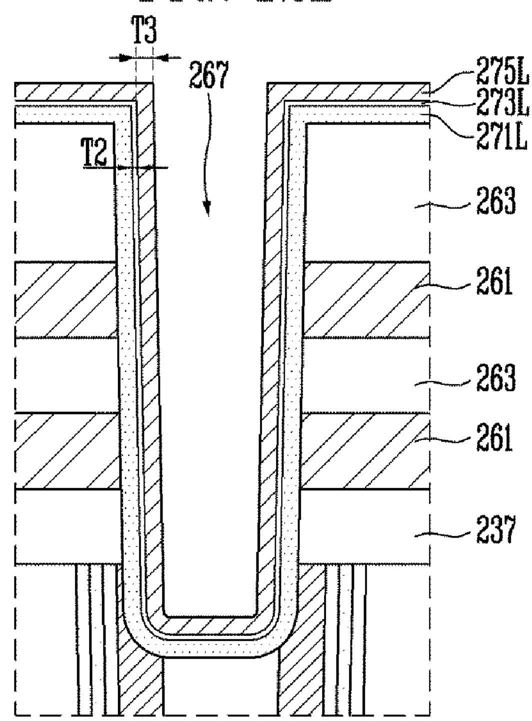

Referring to FIG. 12B, an undoped semiconductor layer 275L may be formed on the surface of the barrier layer 273L. In an embodiment, the undoped semiconductor layer 275L may include undoped silicon. The thickness T3 of the undoped semiconductor layer 275L may be controlled to be greater than the thickness T2 of the barrier layer 273L. The barrier layer 273L may prevent the occurrence of a phenomenon in which dopants from the doped semiconductor layer 271L are diffused to the undoped semiconductor layer 275L.

Figure 12C:
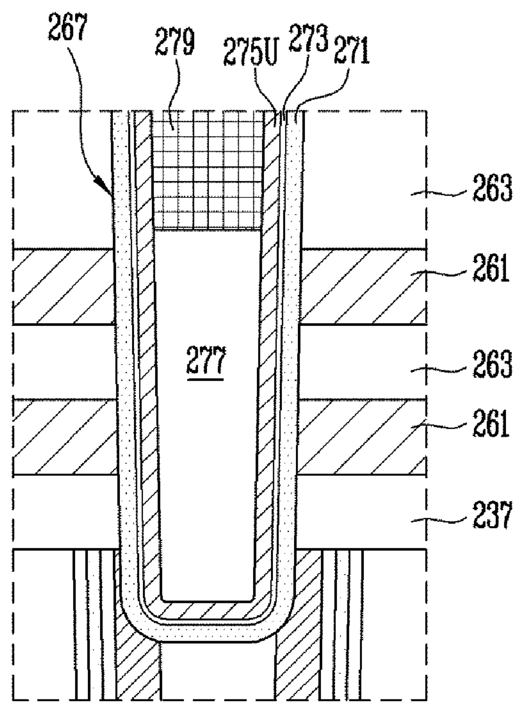

Referring to FIG. 12C, a second core insulating layer 277 and a capping pattern 279 may be formed in a central region of the hole 267 using the process, described above with reference to FIG. 10C. Respective parts of the undoped semiconductor layer 275L, the barrier layer 273L, and the doped semiconductor layer 271L which cover a top surface of the second upper interlayer insulating layer 263, illustrated in FIG. 12B, may be removed through a planarization process. In this way, the doped semiconductor layer 271L may remain as a preliminary doped semiconductor pattern 271 in the hole 267, the barrier layer 273L may remain as a barrier pattern 273 in the hole 267, and the undoped semiconductor layer 275L may remain as an undoped semiconductor pattern 275U in the hole 267.

Figure 12D:
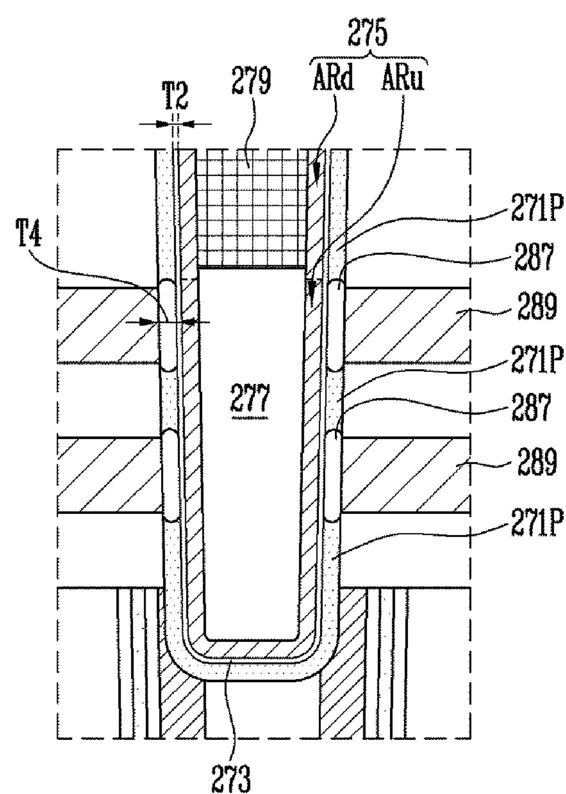

Referring to FIG. 12D, gate regions may be opened by removing the sacrificial layers 261 illustrated in FIG. 12C, using the processes described above with reference to FIGS. 9C and 9D.

Next, gate insulating layers 287 may be formed using the processes described above with reference to FIGS. 10D and 10E.

An oxidization process for the preliminary doped semiconductor pattern to form the gate insulating layers 287 may be controlled such that an oxidized region of the preliminary doped semiconductor pattern comes into contact with the barrier pattern 273. Accordingly, the preliminary doped semiconductor pattern 271 illustrated in FIG. 12C may be separated into doped semiconductor patterns 271P by the gate insulating layers 287. In an embodiment, the thickness T4 of each of the gate insulating layers 287 may be formed to be greater than the thickness T2 of the barrier pattern 273.

After the gate insulating layers 287 have been formed, dopants of the capping pattern 279 may be diffused into the undoped semiconductor pattern 275U illustrated in FIG. 12C. As a result, a semiconductor pattern 275 including a doped area ARd and an undoped area ARu may be defined. The doped area ARd may surround a sidewall of the capping pattern 279, and the undoped area ARu may be defined along a sidewall and a bottom surface of the second core insulating layer 277.

Thereafter, conductive patterns 289 respectively surrounding the gate insulating layers 287 may be formed using the process, described above with reference to FIG. 10F.

Figure 13A:
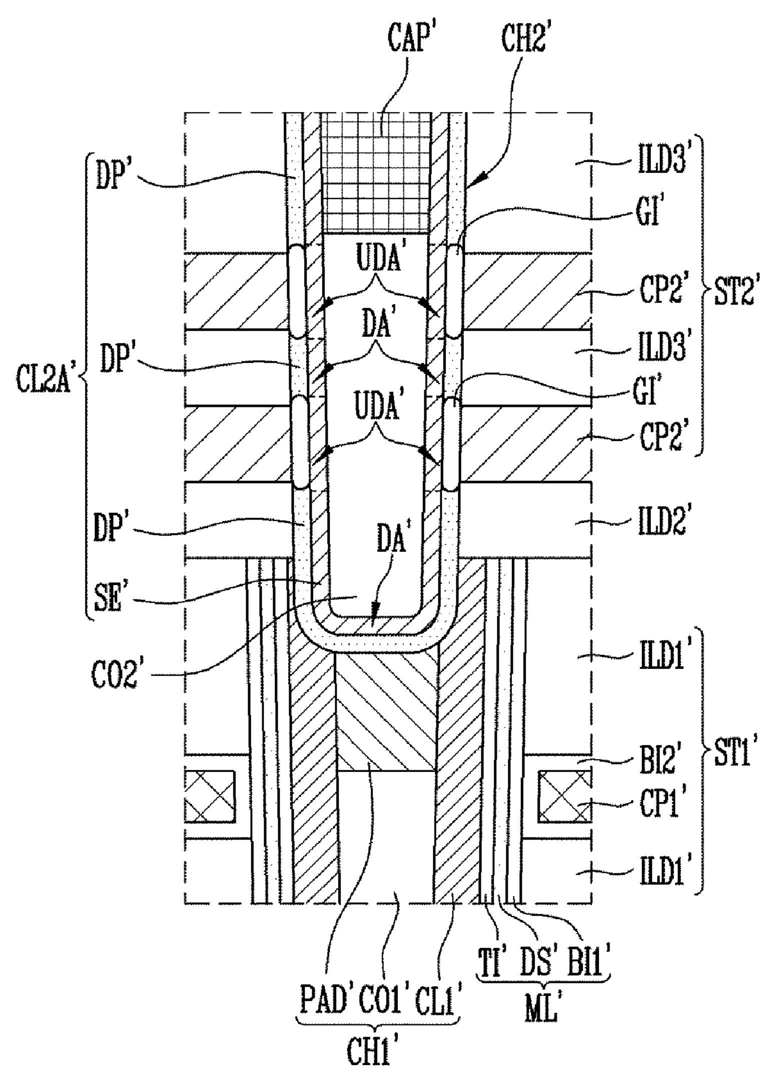
FIGS. 13A and 13B are sectional views illustrating channel structures according to embodiments of the present disclosure.
Figure 13B:
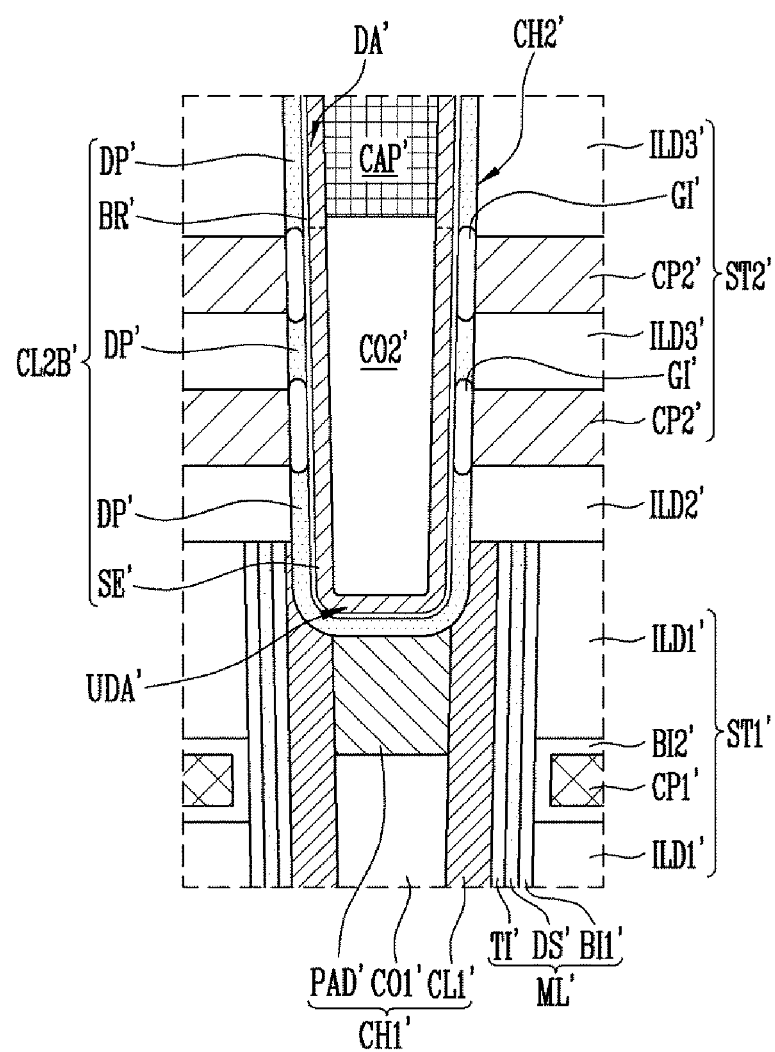

FIGS. 13A and 13B are sectional views illustrating first and second channel structures CH1' and CH2' according to embodiments of the present disclosure. Each of the first channel structures CH1A and CH1B illustrated in FIG. 3 may be replaced with the first channel structure CH1', illustrated in FIG. 13A or 13B. Each of the second channel structures CH2A and CH2B illustrated in FIG. 3 may be replaced with the second channel structure CH2, illustrated in FIG. 13A or 13B.

Referring to FIGS. 13A and 13B, the first channel structure CH1' may penetrate a first stacked body ST1'. The first stacked body ST1' may include first interlayer insulating layers ILD1' and first conductive patterns CP1' which are alternately stacked, as described above with reference to FIG. 3.

A sidewall of the first channel structure CH1' may be surrounded by a memory layer ML'. As described above with reference to FIGS. 4A and 4B, the memory layer ML' may include a tunnel insulating layer TI', a data storage layer DS', and a first blocking insulating layer BI1'.

As described above with reference to FIGS. 4A and 4B, a second blocking insulating layer BI2' may be disposed between the first conductive pattern CP1' and the memory layer ML', and may extend to space between the first conductive pattern CP1' and the first interlayer insulating layer ILD1'.

The first channel structure CH1' may include a first core insulating layer CO1', a first channel layer CL1', and a pad pattern PAD'. The pad pattern PAD' may overlap the first core insulating layer CO1'. The first core insulating layer CO1' and the pad pattern PAD' may penetrate the first stacked body ST1', and the first channel layer CL1' may extend to surround a sidewall of the first core insulating layer CO1' and a sidewall of the pad pattern PAD'. In an embodiment, the first channel layer CL1' may include an undoped semiconductor layer. In an embodiment, the undoped semiconductor layer may include undoped silicon. The pad pattern PAD' may include an undoped semiconductor layer or a doped semiconductor layer.

As described above with reference to FIG. 3, the second channel structure CH2' may penetrate a second interlayer insulating layer ILD2' covering the first stacked body ST1' and a second stacked body ST2' overlapping the first stacked body ST1', with the second interlayer insulating layer ILD2' interposed therebetween. As described above with reference to FIG. 3, the second stacked body ST2' may include second conductive patterns CP2' and third interlayer insulating layers ILD3' which are alternately stacked.

A sidewall of the first channel structure CH1' may be surrounded by the memory layer ML'. As described above with reference to FIGS. 4A and 4B, the memory layer ML' may include a tunnel insulating layer TI', a data storage layer DS', and a first blocking insulating layer BI1'.

As described above with reference to FIG. 3, the second channel structure CH2' may include a second core insulating layer CO2', a capping pattern CAP', and a second channel layer CL2A' or CL2B'. As described above with reference to FIG. 3, gate insulating layers GI' may be respectively disposed between the second channel structure CH2' and the second conductive patterns CP2'.

Referring to FIG. 13A, the second channel layer CL2A' may include a semiconductor pattern SE' and doped semiconductor patterns DP', as described above with reference to FIG. 4A. As described above with reference to FIG. 4A, the semiconductor pattern SE' may include undoped areas UDA' and doped areas DA'.

Referring to FIG. 13B, the second channel layer CL2B' may include a semiconductor pattern SE', a barrier pattern BR', and doped semiconductor patterns DP', as described above with reference to FIG. 4B. As described above with reference to FIG. 4B, the semiconductor pattern SE' may include a doped area DA' and an undoped area UDA'.

Figure 14:
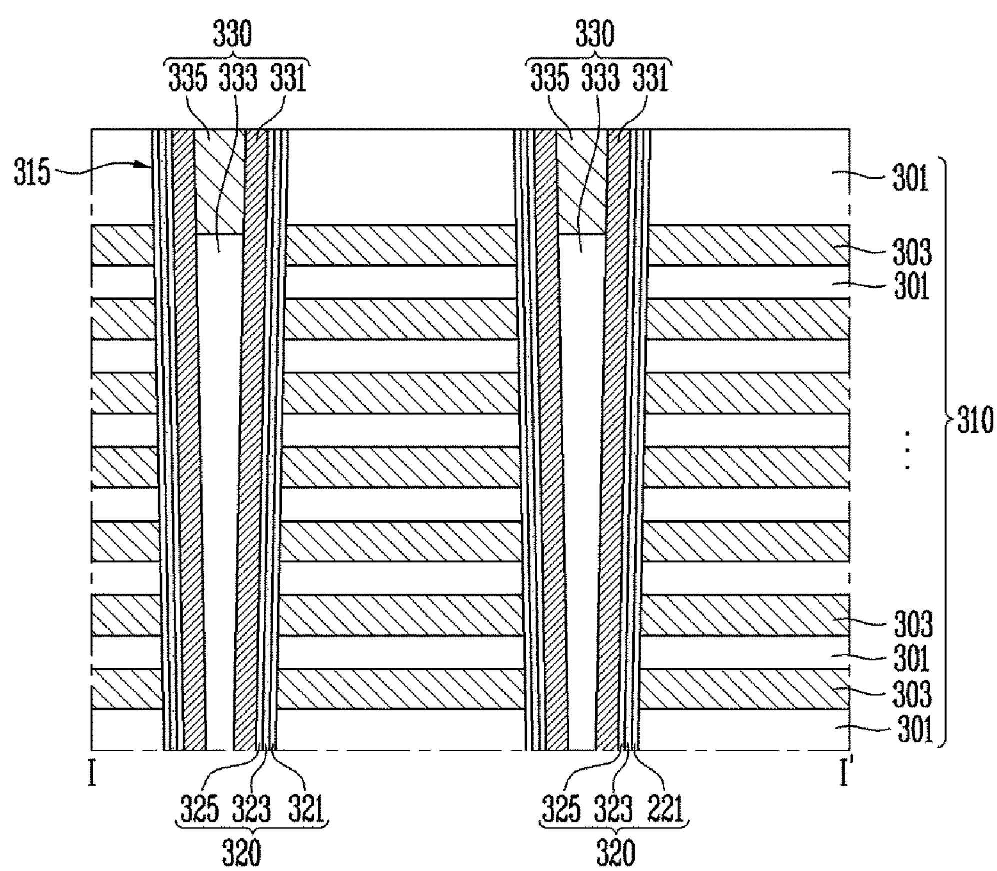
FIG. 14 is a sectional view illustrating the step of forming a first channel structure according to an embodiment of the present disclosure.

FIG. 14 is a sectional view illustrating the step of forming a first channel structure 330 according to an embodiment of the present disclosure. The first channel structure 330 illustrated in FIG. 14 may be to provide the first channel structure CH1' illustrated in FIG. 13A or 13B.

Referring to FIG. 14, holes 315 passing through lower interlayer insulating layers 301 and first sacrificial layers 303 of a first preliminary stacked body 310 may be performed using the processes described above with reference to FIG. 7A.

Thereafter, a memory layer 320 including a first blocking insulating layer 321, a data storage layer 323, and a tunnel insulating layer 325 may be formed on a sidewall of each of the holes 315 using the processes described above with reference to FIG. 7A. Next, a channel layer 331 and a core insulating layer 333 may be formed in each of the holes 315 using the processes described above with reference to FIG. 7A. Thereafter, a part of the core insulating layer 333 may be removed such that the top of each of the holes 315 is opened. The opened top of each of the holes 315 may be filled with a pad pattern 335. The pad pattern 335 may include an undoped semiconductor layer or a doped semiconductor layer.

The pad pattern 335, the channel layer 331, and the memory layer 320 may be planarized using a planarization process. In this way, the top surface of the preliminary stacked body 310 may be exposed, and first channel structures 330, each including the channel layer 331, the core insulating layer 333, and the pad pattern 335, may be defined in the holes 315, respectively.

Next, the processes described above with reference to FIGS. 7B and 7C, the processes described above with reference to FIGS. 10A, 10B, 10C, 10D, 10E, and 10F, and the processes described above with reference to FIG. 11 may be performed. In other embodiments, the processes described above with reference to FIGS. 7B and 7C, the processes described above with reference to FIGS. 12A, 12B, 12C, and 12D, and the processes described above with reference to FIG. 11 may be performed.

Figure 15:
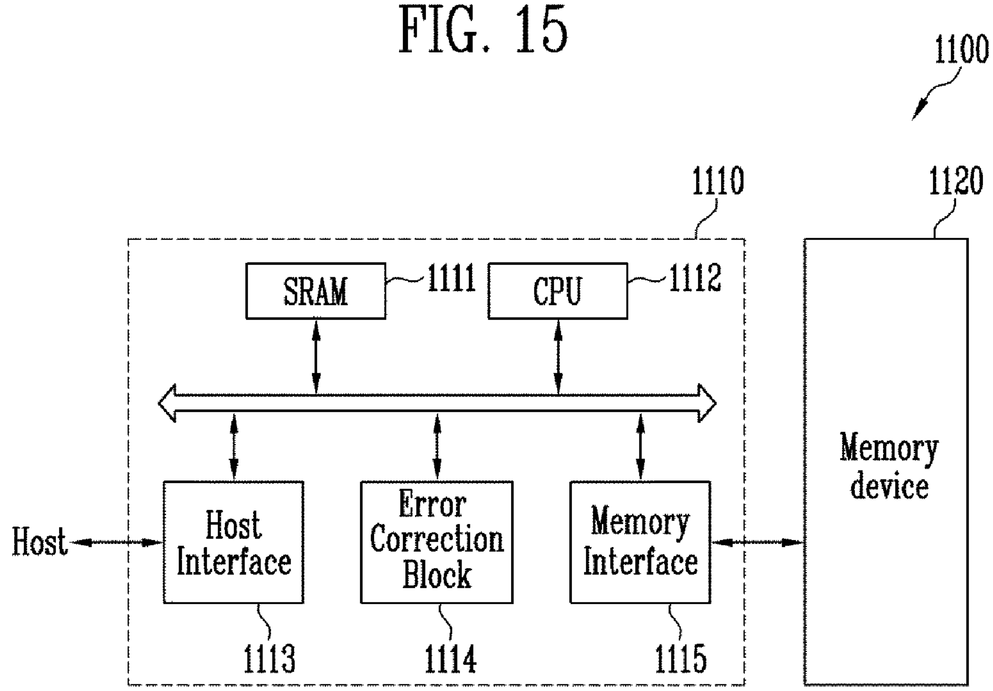
FIG. 15 is a block diagram illustrating the configuration of a memory system according to an embodiment of the present disclosure.

FIG. 15 is a block diagram illustrating a memory system 1100 according to an embodiment of the present disclosure.

Referring to FIG. 15, the memory system 1100 includes a memory device 1120 and a memory controller 1110.

The memory device 1120 may include a stacked body including interlayer insulating layers and a conductive pattern disposed between the interlayer insulating layers, a channel structure penetrating the stacked body, and a gate insulating layer between the channel structure and the conductive pattern. A channel layer of the channel structure may include a semiconductor pattern including an undoped area surrounded by a gate insulating layer, and doped semiconductor patterns surrounded by interlayer insulating layers. The memory device 1120 may generate a gate induced drain leakage (GIDL) current during an erase operation. The doped semiconductor patterns may improve the GIDL current, and the undoped area may improve the turn-off characteristics of a transistor including a gate coupled to a conductive pattern.

The memory device 1120 may be a multi-chip package composed of a plurality of flash memory chips.

The memory controller 1110 may control the memory device 1120, and may include a static random access memory (SRAM) 1111, a central processing unit (CPU) 1112, a host interface 1113, an error correction block 1114, and a memory interface 1115. The SRAM 1111 is used as a working memory of the CPU 1112, the CPU 1112 performs general control operations for data exchange of the memory controller 1110, and the host interface 1113 is provided with a data interchange protocol of a host coupled to the memory system 1100. Further, the error correction block 1114 detects and corrects an error included in data that is read from the memory device 1120, and the memory interface 1115 interfaces with the memory device 1120. In addition, the memory controller 1110 may further include a read only memory (ROM) or the like that stores code data for interfacing with the host.

Figure 16:
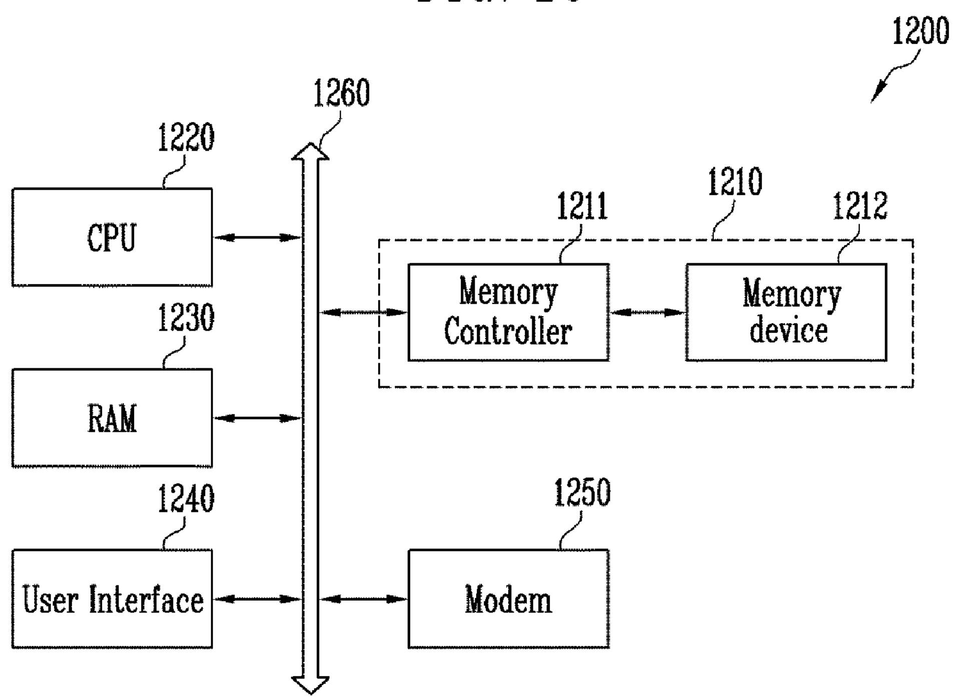
FIG. 16 is a block diagram illustrating the configuration of a computing system according to an embodiment of the present disclosure.

FIG. 16 is a block diagram illustrating the configuration of a computing system according to an embodiment of the present disclosure.

Referring to FIG. 16, a computing system 1200 according to an embodiment of the present disclosure may include a CPU 1220, a random access memory (RAM) 1230, a user interface 1240, a modem 1250, and a memory system 1210 which are electrically coupled to a system bus 1260. The computing system 1200 may be a mobile device.

The memory system 1210 may include a memory device 1212 and a memory controller 1211. The memory device 1212 may include a stacked body including interlayer insulating layers and a conductive pattern disposed between the interlayer insulating layers, a channel structure penetrating the stacked body, and a gate insulating layer between the channel structure and the conductive pattern. A channel layer of the channel structure may include a semiconductor pattern including an undoped area surrounded by a gate insulating layer, and doped semiconductor patterns surrounded by interlayer insulating layers.

In accordance with the present disclosure, a channel structure penetrating a stacked body of a conductive pattern and an interlayer insulating layer may include a doped semiconductor pattern and an undoped area. Thus, there can be provided a select transistor including a gate coupled to a conductive pattern and a channel including a doped semiconductor pattern and an undoped area.

In accordance with the present disclosure, channel current characteristics may be improved through the doped semiconductor pattern. Thus, the present disclosure may stably generate a gate induced drain leakage (GIDL) current for an erase operation, thus improving the operational reliability of a semiconductor memory device.

In accordance with the present disclosure, the turn-off characteristics of the select transistor may be improved through the undoped area. Thus, the present disclosure may improve the operational reliability of a semiconductor memory device.

What is claimed is:

1. A method of manufacturing a semiconductor memory device, comprising:
   - forming interlayer insulating layers and sacrificial layers that are alternately stacked;
   - forming a hole passing through the interlayer insulating layers and the sacrificial layers;
   - forming a doped semiconductor layer on a surface that defines the hole;
   - forming an undoped semiconductor layer on the doped semiconductor layer;
   - opening gate regions by removing the sacrificial layers;
   - forming gate insulating layers by oxidizing a part of the doped semiconductor layer through the gate regions;
   - leaving non-oxidized areas of the doped semiconductor layer as doped semiconductor patterns, wherein the doped semiconductor patterns are spaced apart from each other by the gate insulating layers; and
   - forming conductive patterns to surround the gate insulating layers and fill the gate regions.

2. The method according to claim 1, wherein the interlayer insulating layers and the sacrificial layers are formed on a lower stacked body, the lower stacked body including lower interlayer insulating layers and lower conductive patterns, which surround a channel structure and are alternately stacked.

3. The method according to claim 2, wherein the hole overlaps the channel structure.

4. The method according to claim 1, further comprising:
   - forming a core insulating layer on the undoped semiconductor layer to fill a part of the hole;
   - forming a capping pattern on the core insulating layer; and
   - planarizing the doped semiconductor layer and the undoped semiconductor layer so that a preliminary channel structure filling the hole is defined.

5. The method according to claim 4, wherein the capping pattern includes a semiconductor material doped with dopants of a same type as the doped semiconductor layer.

6. The method according to claim 1, wherein forming the gate insulating layers comprises:
   - forming grooves in a sidewall of the doped semiconductor layer by removing a part of the doped semiconductor layer exposed through the gate regions; and
   - oxidizing the doped semiconductor layer from a surface of the doped semiconductor layer exposed through the grooves.

7. The method according to claim 1, wherein each of the doped semiconductor patterns is disposed between each of the interlayer insulating layers and the undoped semiconductor layer.

8. The method according to claim 6, wherein oxidizing the doped semiconductor layer is controlled such that oxidized areas of the doped semiconductor layer come into contact with the undoped semiconductor layer.

9. The method according to claim 1, further comprising:

after forming the gate insulating layers, diffusing dopants from the doped semiconductor layer to a partial region of the undoped semiconductor layer.

10. The method according to claim 1, further comprising:

before the undoped semiconductor layer is formed, forming a barrier layer on the doped semiconductor layer, wherein forming the gate insulating layers comprises:

forming grooves in a sidewall of the doped semiconductor layer by removing a part of the doped semiconductor layer exposed through the gate regions; and oxidizing the doped semiconductor layer from a surface of the doped semiconductor layer exposed through the grooves.

11. The method according to claim 10, wherein oxidizing the doped semiconductor layer is controlled such that oxidized areas of the doped semiconductor layer come into contact with the barrier layer.

12. The method according to claim 10, wherein:

the barrier layer is formed to be thinner than the doped semiconductor layer, the undoped semiconductor layer is formed to be thicker than the barrier layer, and the gate insulating layers are formed to be thicker than the barrier layer.

* * * * *